(12) United States Patent
Yorikado et al.

(10) Patent No.: US 9,059,062 B2
(45) Date of Patent: Jun. 16, 2015

(54) SOLID-STATE IMAGING DEVICE, METHOD OF MANUFACTURING THE SAME, AND ELECTRONIC APPARATUS

(75) Inventors: Yuhi Yorikado, Kumamoto (JP); Shinji Miyazawa, Kanagawa (JP); Takeshi Yanagita, Tokyo (JP)

(73) Assignee: SONY CORPORATION (JP)

( * ) Notice: Subject to any disclaimer, the term of this patent is extended or adjusted under 35 U.S.C. 154(b) by 0 days.

(21) Appl. No.: 12/945,169

(22) Filed: Nov. 12, 2010

(65) Prior Publication Data
US 2011/0127629 A1    Jun. 2, 2011

(30) Foreign Application Priority Data

Nov. 30, 2009  (JP) ................................. 2009-272442

(51) Int. Cl.
*H01L 23/544* (2006.01)
*H01L 27/146* (2006.01)
*H04N 9/07* (2006.01)

(52) U.S. Cl.
CPC .... *H01L 27/14643* (2013.01); *H01L 27/14603* (2013.01); *H01L 27/1463* (2013.01); *H01L 27/14689* (2013.01); *H04N 9/07* (2013.01); *H01L 27/14627* (2013.01)

(58) Field of Classification Search
CPC . H01L 23/544; H01L 27/146; H01L 27/1463; H01L 27/14643
USPC .......... 257/432, 446, 797, E31.127, E31.001, 257/E27.13, E23.179; 438/69, 70, 73, 75
See application file for complete search history.

(56) References Cited

U.S. PATENT DOCUMENTS

| | | | | |
|---|---|---|---|---|
| 8,138,533 | B2 * | 3/2012 | Koike et al. | 257/292 |
| 2004/0198017 | A1 * | 10/2004 | Chang et al. | 438/401 |
| 2006/0134881 | A1 * | 6/2006 | Woo et al. | 438/424 |
| 2006/0197007 | A1 * | 9/2006 | Iwabuchi et al. | 250/208.1 |
| 2008/0081466 | A1 * | 4/2008 | Matsuo et al. | 438/672 |
| 2009/0140365 | A1 * | 6/2009 | Lee et al. | 257/460 |
| 2009/0315132 | A1 * | 12/2009 | Kohyama | 257/432 |
| 2009/0321888 | A1 * | 12/2009 | Liu et al. | 257/618 |
| 2010/0181637 | A1 * | 7/2010 | Harada et al. | 257/459 |
| 2010/0230773 | A1 * | 9/2010 | Nakazawa et al. | 257/459 |
| 2010/0237451 | A1 * | 9/2010 | Murakoshi | 257/432 |

FOREIGN PATENT DOCUMENTS

| | | |
|---|---|---|
| JP | 2002-208629 | 7/2002 |
| JP | 2005-150463 | 6/2005 |
| JP | 2005-268738 | 9/2005 |
| JP | 2008-182142 | 8/2008 |
| JP | 2009-272597 | 11/2009 |

OTHER PUBLICATIONS

Official Action (no English translation available) for Japanese Patent Application No. 2009-272442 mailed Dec. 3, 2013, 4 pages.

* cited by examiner

*Primary Examiner* — Christine Enad
(74) *Attorney, Agent, or Firm* — Sheridan Ross P.C.

(57) ABSTRACT

A solid state imaging device including a semiconductor layer, an insulating material in an opening penetrating a surface of the semiconductor layer, and a protective film that is resistant to etching covering one end of the insulating material on an interior side of the semiconductor layer.

21 Claims, 23 Drawing Sheets

SOLID-STATE IMAGING DEVICE, METHOD OF MANUFACTURING THE SAME, AND ELECTRONIC APPARATUS

RELATED APPLICATION DATA

The present application claims priority to Japanese Patent Application JP 2009-272442, filed in the Japan Patent Office on Nov. 30, 2009, which is incorporated herein by reference in its entirety.

FIELD OF THE INVENTION

The present invention relates to a solid-state imaging device, a method of manufacturing the solid-state imaging device, and an electronic apparatus using the solid-state imaging device.

BACKGROUND OF THE INVENTION

A solid-state imaging device is largely divided into a Charge Coupled Device (CCD) type solid-state imaging device and a Complementary Metal Oxide Semiconductor (CMOS) type solid-state imaging device.

In such a solid-state imaging device, a light sensing portion formed of a photodiode is formed in each pixel and, in the light sensing portion, signal charges are generated by photoelectric conversion by light incident to the light sensing portion. In the CCD type solid-state imaging device, the signal charges generated by the light sensing portion are transferred into a charge transfer unit having a CCD structure, and pixel charges are converted into pixel signals that are outputted as an output signal. On the other hand, in the CMOS type solid-state imaging device, the signal charges generated by the light sensing portion are amplified in each pixel and the amplified signals are output to signal lines as pixel signals.

With the distance between a photodiode formed on a substrate and a light incident surface being reduced to improve focusing efficiency, there has been proposed a rear-surface irradiation type solid-state imaging device for making light incident from a rear surface side which is opposite to a side, in which a wiring layer is formed, of the substrate. In this rear-surface irradiation type solid-state imaging device, after the wiring layer is formed on a front surface side of the substrate, on which the photodiode or a pixel transistor is formed, the substrate is reversed, and a color filter layer and an on-chip lens is formed on the rear surface side of the substrate. In the rear-surface irradiation type solid-state imaging device, since the substrate is reversed and the color filter layer or the on-chip lens is then formed on the rear surface side of the substrate, an alignment mark necessary for positioning the color filter layer or the on-chip lens is formed on the rear surface side of the substrate. In addition, in the rear-surface irradiation type solid-state imaging device, in order to lead out an electrode pad forming region formed in the wiring layer of the front surface side of the substrate to the rear surface side of the substrate, an opening where the electrode pad forming region is exposed is formed from the rear surface side of the substrate. In order to connect an external wiring from the rear surface side of the substrate, an opening where the electrode pad forming region is exposed is formed.

Japanese Unexamined Patent Application Publication No. 2005-150463 describes a method of forming an alignment mark in a rear-surface irradiation type solid-state imaging device and a method of forming a pad contact connected to an electrode pad. In Japanese Unexamined Patent Application Publication No. 2005-150463, in order to form the alignment mark or secure an insulation property between the pad contact and a substrate, a configuration in which, after an opening is formed in the substrate, an insulating material such as SiO is buried so as to form an insulating layer is described.

A process of manufacturing a rear-surface irradiation type solid-state imaging device of the related art will be described with reference to FIGS. 25A to 25C. FIGS. 25A to 25C shows a process of manufacturing a rear-surface irradiation type solid-state imaging device in the case where an alignment mark and an insulating layer around an electrode pad portion is formed of SiO.

First, as shown in FIG. 25A, using an SOI substrate 103 in which a buried oxide film (BOX layer 101) and a silicon layer 102 are sequentially formed on a silicon substrate 100, a pixel including photodiodes PD is formed at a predetermined position of a pixel region 108 of the silicon layer 102. Thereafter, after an oxide film 104 is formed on the surface of the silicon layer 102, an opening reaching the BOX layer 101 through the silicon layer 102 is formed in an alignment mark forming region 107 and an electrode pad forming region 106. Then, an insulating material formed of SiO is buried so as to form an insulating layer 105.

Next, a plurality of wiring layers 109 is formed on the surface of the silicon layer 102 with an interlayer insulating film 110 interposed therebetween so as to form a multi-layer wiring layer 111.

Thereafter, a support substrate (not shown) is formed on the multi-layer wiring layer 111, the element is reversed, and the silicon substrate 100 and the BOX layer 101 of the SOI substrate 103 are polished. Then, an opening is formed in a region surrounded by the insulating layer 105 formed in the electrode pad forming region 106 such that an electrode pad 112 is exposed. Using the insulating layer 105 formed in the alignment mark forming region 107 as an alignment mark, a color filter layer 114 and an on-chip lens 113 are formed on the silicon layer 102 of the pixel region 108. Accordingly, the rear-surface irradiation type solid-state imaging device is completed.

However, in the manufacturing method of the related art, when the silicon substrate 100 and the BOX layer 101 are etched and removed, the alignment mark 105a or the insulating layer 105 formed of SiO may be etched. Then, as shown in FIG. 25C, the alignment mark 105a or the insulating layer 105 of the electrode pad forming region are excessively removed to a position deeper than the surface of the silicon layer 102. Since the alignment mark 105a is excessively etched and removed, visibility deteriorates. In the case where the alignment mark 105a is formed so as to protrude from the rear surface side of the silicon layer 102 so as to improve visibility, an insulating material other than SiO is used in the alignment mark 105a.

The alignment mark 105a or the opening formed in the insulating layer 105 of the electrode pad forming region 106 has a relatively high aspect ratio. Therefore, when SiO is used as a material buried in the opening, it is difficult to bury the opening. As shown in FIG. 26, a void 120 is generated.

In order to solve the above problem generated when SiO is used in the alignment mark 105a, silicon nitride SiN may be used as an insulating material buried in the opening. In this case, in the process of FIG. 25A, as shown in FIG. 27A, after an opening for an alignment mark is formed, an insulating material 116 formed of SiN is buried in the opening.

In the process of manufacturing the solid-state imaging device, after a process of burying the insulating material 116 which becomes the alignment mark 105a, for example, a process of removing the insulating material 116 on the oxide film 104 is performed. For example, in the case where the unnecessary insulating material 116 formed of SiN on the oxide film 104 is removed using hot phosphoric acid, as shown in FIG. 27B, the upper portion of SiN formed as the alignment mark 105*a* or the insulating layer 105 of the electrode pad forming region 106 is etched and removed. Then, unevenness denoted by a region a is formed in the upper portion of the insulating layer.

In the case where unevenness is formed, as shown in FIG. 28A, for example, polysilicon 118 is deposited on the etched-off insulating layer 105. In this case, a short circuit between the polysilicon 118 and the silicon layer 102 occurs. Then, in the electrode pad forming region 106, insulation between the silicon layer 102 and a contact wiring (not shown) connected to the electrode pad 112 is not secured. As shown in FIG. 28B, in the case where a silicon oxide film 117 is formed on the etched-off insulating layer 105 in a subsequent process, the silicon oxide film 117 on the insulating layer 105 with unevenness is peeled. In this case, wafer contamination or device contamination may occur.

Even in the case where the insulating layer 105 is formed of silicon oxide, silicon oxide configuring the upper portion of the insulating layer may be removed when the unnecessary silicon oxide is removed. Even in this case, the problem of FIG. 28A or 28B occurs.

SUMMARY OF THE INVENTION

The present invention provides a solid-state imaging device having an insulating layer with high reliability without increasing the number of processes to produce same. In addition, the invention provides an electronic apparatus using the solid-state imaging device.

One embodiment consistent with the present invention includes a solid state imaging device including a semiconductor layer, an insulating material in an opening penetrating a surface of the semiconductor layer, and a protective film that is resistant to etching covering one end of the insulating material on an interior side of the semiconductor layer.

Another embodiment consistent with the present embodiment includes a solid state imaging device where the semiconductor layer has a pixel forming region.

Another embodiment consistent with the present embodiment includes a solid state imaging device where a opening is in an alignment region of the semiconductor layer, and the semiconductor layer has an element isolation region between the alignment region and the pixel forming region.

Another embodiment consistent with the present embodiment includes a solid state imaging device where the protective film is in a groove in the semiconductor substrate at the end of the opening.

Another embodiment consistent with the present embodiment includes a solid state imaging device that includes an impurity diffusion layer in the element isolation region and an insulating film formed over the diffusion layer.

Another embodiment consistent with the present embodiment includes a solid state imaging device that includes a multi-layer wiring layer carried on the semiconductor layer, an electrode pad in the multi-layer wiring layer outside of the pixel region of the semiconductor substrate, and an electrode pad opening through the semiconductor layer and multi-layer wiring layer that exposes the electrode pad.

Another embodiment consistent with the present embodiment includes a solid state imaging device including a plurality of photodiodes in the semiconductor layer in the pixel region.

Another embodiment consistent with the present embodiment includes a solid state imaging device including an on-chip lens over each photodiode in the pixel region.

Another embodiment consistent with the present embodiment includes a solid state imaging device including a color filter between each on-chip lens and each photodiode.

Another embodiment consistent with the present embodiment includes a solid state imaging device including an insulating material and a protective film both made of the same material.

Another embodiment consistent with the present embodiment includes a solid state imaging device where the insulating material contains silicon nitride.

Another embodiment consistent with the present embodiment includes a method of manufacturing a semiconductor device, including the steps of forming an opening which penetrates a semiconductor layer, filling the opening with an insulating material, and forming a protective film that is resistant to etching at one end of the opening on an interior side of the semiconductor layer.

Another embodiment consistent with the present embodiment includes a method of manufacturing a semiconductor device where the semiconductor layer has a pixel region.

Another embodiment consistent with the present embodiment includes a method of manufacturing a semiconductor device where the opening is formed in an alignment region of the semiconductor layer, and the semiconductor layer has an element isolation region between the alignment region and the pixel region.

Another embodiment consistent with the present embodiment includes a method of manufacturing a semiconductor device that includes the step of forming a groove in the semiconductor substrate at the end of the opening on the interior side of the semiconductor substrate before the step of forming the insulation film where the, where the step of forming the protective film comprises forming the insulation film in the groove.

Another embodiment consistent with the present embodiment includes a method of manufacturing a semiconductor device that includes the step of forming an impurity diffusion layer in the element isolation region; and forming an insulating film over the diffusion layer.

Another embodiment consistent with the present embodiment includes a method of manufacturing a semiconductor device that includes the steps of forming a multi-layer wiring layer over the semiconductor layer, forming an electrode pad in the multilayer wiring layer outside the pixel region of the semiconductor substrate, and forming an electrode pad opening in the semiconductor layer to expose the electrode pad.

Another embodiment consistent with the present embodiment includes a method of manufacturing a semiconductor device furthering including the step of forming a plurality of photodiodes in the semiconductor layer in the pixel region.

Another embodiment consistent with the present embodiment includes a method of manufacturing a semiconductor device furthering including the step of forming an on-chip lens over each photodiode in the pixel region.

Another embodiment consistent with the present embodiment includes a method of manufacturing a semiconductor device further including the step of forming a color filter between each on-chip lens and each photodiode.

Another embodiment consistent with the present embodiment includes a method of manufacturing a semiconductor device where the insulating material and the protection film are both made of the same material.

Another embodiment consistent with the present embodiment includes a method of manufacturing a semiconductor device where the protection film is formed on the insulating material such that the insulating material remains after etching.

Another embodiment consistent with the present invention includes an electronic apparatus including an optical lens, a semiconductor device (a) located in front of the optical lens and (b) which includes (1) a semiconductor layer, (2) insulating material in an opening penetrating the semiconductor layer, and (3) a protective film that is resistant to etching which covers one end of the insulating material on an interior side of the semiconductor layer.

Another embodiment consistent with the present invention includes an electronic apparatus where the semiconductor layer has a pixel region.

Another embodiment consistent with the present invention includes an electronic apparatus where the opening is in an alignment region of the semiconductor layer, and the semiconductor layer has an element isolation region between the alignment region and the pixel forming region.

Another embodiment consistent with the present invention includes an electronic apparatus where the protective film is in a groove in the semiconductor substrate at an end of the insulating material on the interior side of the semiconductor substrate Another embodiment consistent with the present invention includes an electronic apparatus further comprising an impurity diffusion layer in the element isolation region, and an insulating film over the diffusion layer.

Another embodiment consistent with the present invention includes an electronic apparatus further comprising a multi-layer wiring layer over the semiconductor layer, an electrode pad in the multi-layer wiring layer outside the pixel region of the semiconductor substrate, and an electrode pad opening through the semiconductor layer and multi-layer wiring layer that exposes the electrode pad.

Another embodiment consistent with the present invention includes an electronic apparatus further comprising a plurality of photodiodes in the semiconductor layer in the pixel region.

Another embodiment consistent with the present invention includes an electronic apparatus further comprising an on-chip lens on each photodiode in the pixel region.

Another embodiment consistent with the present invention includes an electronic apparatus further comprising a color filter between each on-chip lens and each photodiode.

Another embodiment consistent with the present invention includes an electronic apparatus where the insulating material and the insulating film are both made of the same material.

Another embodiment consistent with the present invention includes an electronic apparatus where the insulating material contains silicon nitride.

Another embodiment consistent with the present invention includes an electronic apparatus further comprising a shutter device located between the optical lens and the solid state imaging device.

According to the embodiments of the present invention, it is possible to obtain a solid-state imaging device with high reliability without increasing the number of processes. In addition, it is possible to obtain an electronic apparatus using the solid-state imaging device.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings.

DESCRIPTION OF THE PRESENTLY PREFERRED EMBODIMENTS

Figure 1:
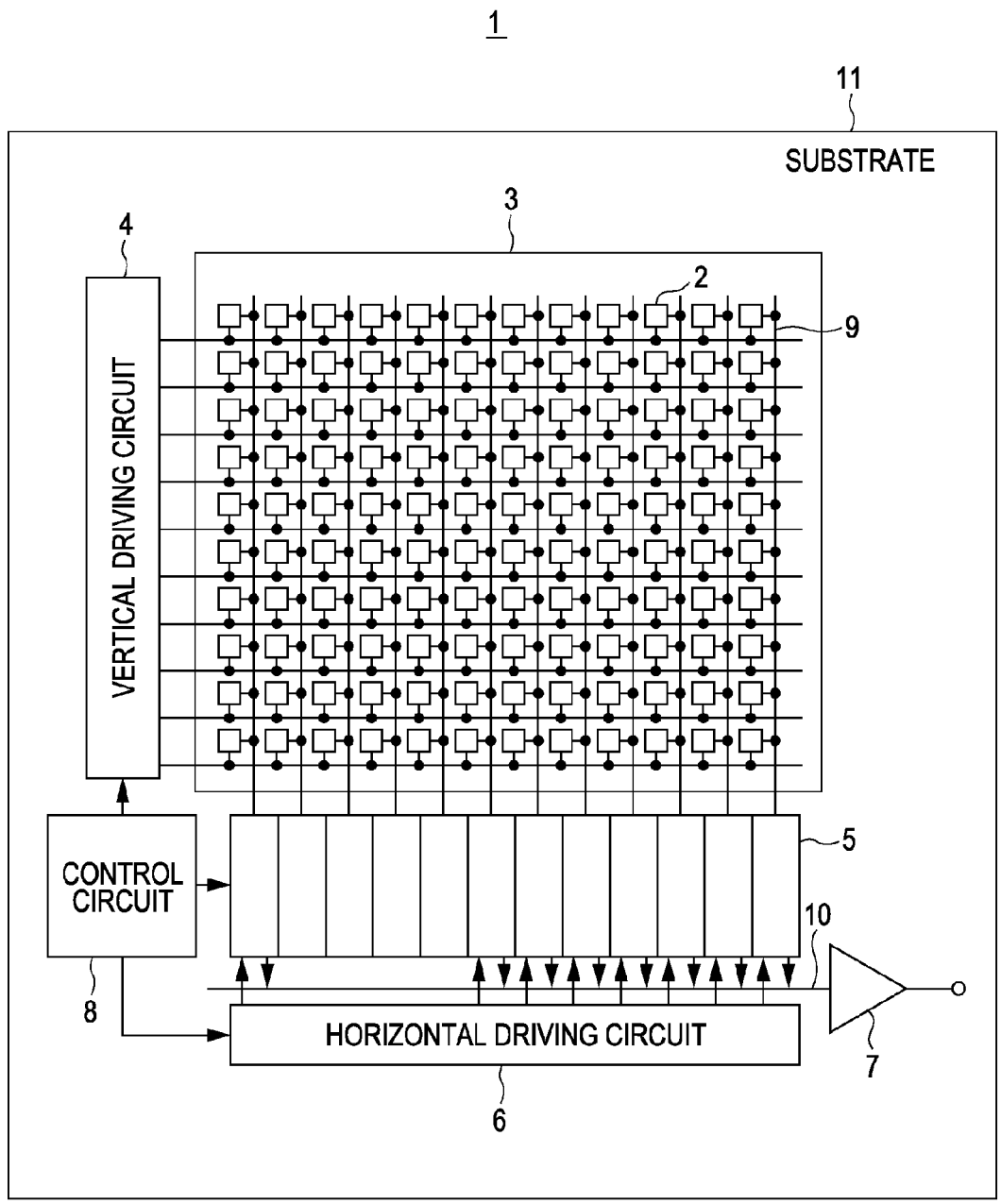
FIG. 1 is a schematic diagram showing a configuration of a solid-state imaging device consistent with the present invention.
Figure 2:
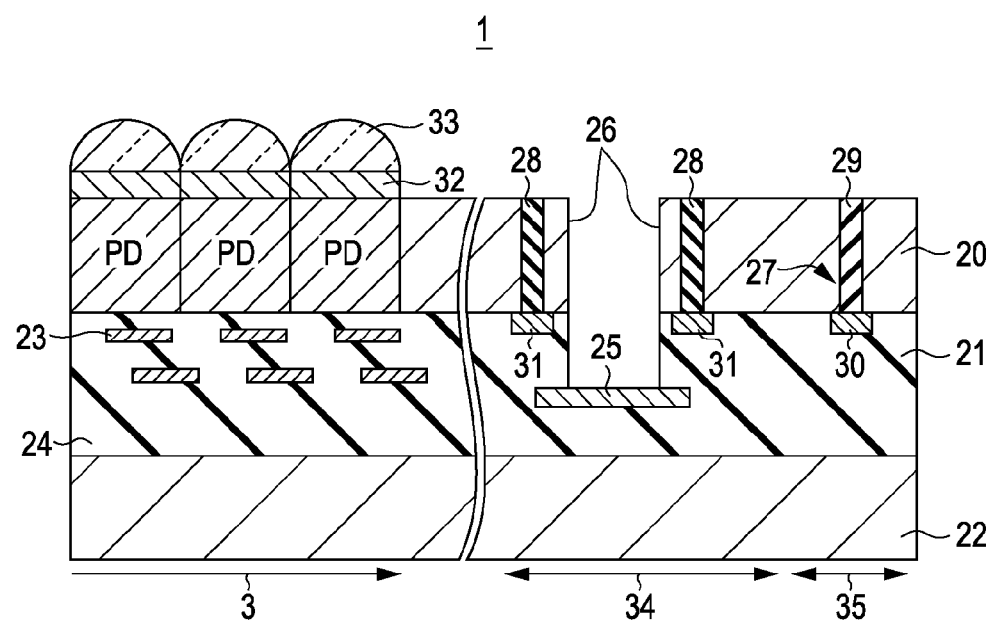
FIG. 2 is a schematic cross-sectional view showing a solid-state imaging device consistent with the present invention.

While various embodiments of the present invention are described herein, it will be apparent to those of skill in the art that many more embodiments and implementations are possible that are within the scope of this invention. Accordingly, the present invention is not to be restricted except in light of the attached claims and their equivalents First, a CMOS-type solid-state imaging device 1 according to an embodiment of the present invention will be described with reference to FIGS. 1 and 2. The configuration of FIGS. 1 and 2 is commonly used in solid-state imaging devices according to the following first to fourth embodiments. In the present embodiment, a rear-surface irradiation type CMOS type solid-state imaging device will be described as the solid-state imaging device.

FIG. 1 is a schematic diagram showing the overall configuration of a CMOS-type solid-state imaging device 1 according to an embodiment of the present invention.

The solid-state imaging device 1 of the present embodiment includes a pixel region 3 in which a plurality of pixels 2 is arranged on a substrate 11 formed of silicon, a vertical driving circuit 4, column signal processing circuits 5, a horizontal driving circuit 6, an output circuit 7, a control circuit 8, and the like.

Each pixel 2 includes a light sensing portion formed of a photodiode and a plurality of pixel transistors and the plurality of pixels 2 is regularly arranged on the substrate 11 in a two-dimensional array. The pixel transistors configuring the pixel 2 may include four pixel transistors including a transfer transistor, a reset transistor, a selection transistor, an amplification transistor, or include three transistors excluding the selection transistor.

The pixel region 3 is composed of the plurality of pixels 2 regularly arranged in the two-dimensional array. The pixel region 3 includes a valid pixel region for actually receiving light, amplifying signal charges generated by photoelectric conversion, and reading a signal to the column signal processing circuits 5 and a black reference pixel region (not shown) for outputting optical black which becomes the reference of a black level. The black reference pixel region is generally formed on the outer circumference of the valid pixel region.

The control circuit 8 generates clock signals, control signals or the like which become the reference of the operation of the vertical driving circuit 4, the column signal processing circuits 5 and the horizontal driving circuit 6 and the like, based on a vertical synchronization signal, a horizontal synchronization signal and a master clock. The clock signals, the control signals or the like generated by the control unit 8 are input to the vertical driving circuit 4, the column signal processing circuits 5, the horizontal driving circuit 6 and the like.

The vertical driving circuit 4 is composed of a shift register so as to sequentially select and scan the pixels 2 of the pixel region 3 in row units in a vertical direction. The photodiode of each pixel 2 supplies a pixel signal based on the signal charges generated according to a light reception amount to the column signal processing circuit 5 through a vertical signal line.

The column signal processing circuit 5 is provided in each column of the pixel 2 so as to perform signal processing such as noise elimination, signal amplification or the like with respect to a signal output from the pixel 2 corresponding to one row in each pixel column, by signals from the black reference pixel region (which, although not shown, is formed around the valid pixel region). A horizontal selection switch (not shown) is provided between the output stage of the column signal processing circuits 5 and the horizontal signal line 10.

The horizontal driving circuit 6 is composed of a shift register, and sequentially outputs horizontal scan pulses so as to sequentially select each of the column signal processing circuits 5, such that a pixel signal from each of the column signal processing units 5 is output to the horizontal signal line 10.

The output circuit 7 performs signal processing with respect to the signal sequentially supplied from each of the column signal processing circuits 5 through the horizontal signal line 10 and outputs the processed signal.

FIG. 2 is a schematic cross-sectional view showing the main parts of the solid-state imaging device according to the present embodiment. As shown in FIG. 2, the solid-state imaging device 1 of the present embodiment includes an alignment mark 27 used for positioning at the time of manufacturing and an electrode pad forming region 34, in which an electrode pad 25 used for connection with an external wiring is formed, in a peripheral region of the pixel region 3.

The rear-surface irradiation type solid-state imaging device 1 includes a semiconductor layer 20 in which photodiodes PD functioning as a photoelectric conversion element are formed, a multi-layer wiring layer 21 formed on the front surface side of the semiconductor layer 20, and color filter layers 32 and on-chip lenses 33 formed on the rear surface side of the semiconductor layer 20. In addition, a support substrate 22 is formed on the surface opposed to the surface of the multi-layer wiring layer 21 facing the semiconductor layer 20.

In the pixel region 3 of the semiconductor layer 20, a plurality of photodiodes PD configuring each pixel is formed, and, although not shown, pixel transistors for driving the pixel 2 are formed near each pixel.

The multi-layer wiring layer 21 is configured by laminating a plurality of wiring layers (two layers in FIG. 2) formed of aluminum or copper with an interlayer insulating film 24 interposed therebetween, and the wirings 23 or the wiring 23 and the pixel transistor are electrically connected by a contact portion (not shown). In the peripheral region, an electrode pad 25 is configured by a portion of the wiring 23 formed of aluminum.

Each color filter layer 32 is formed in a region corresponding to each pixel at the rear surface side which is a light irradiation side of the semiconductor layer 20 and is formed of an organic material including red (R), green (G) and blue (B) pigments. Each on-chip lens 33 is formed of an organic material on each color filter layer 32 in correspondence with each pixel. In each on-chip lens 33, incident light is focused so as to be efficiently made incident to the photodiodes PD configuring the pixel 2 corresponding thereto.

The alignment mark 27 is formed in the peripheral region (hereinafter, referred to as an alignment mark forming region 35) of the semiconductor layer 20 and is configured by an insulating layer 29 formed by burying an insulating material in an opening penetrating the semiconductor layer 20. The insulating layer 29, which is the alignment mark 27, is covered by a protective film 30 in the front surface side of the semiconductor layer 20. The alignment mark 27 is used for positioning of the color filter layers 32 or the on-chip lenses 33 in the rear surface side of the semiconductor layer 20.

In the electrode pad forming region 34 formed in the peripheral region of the semiconductor layer 20, an opening 26 is formed in the semiconductor layer 20 and the interlayer insulating film 24 such that the electrode pad 25 formed in a part of the wiring 23 faces the rear surface side of the semiconductor layer 20. An insulating layer 28 is formed around the opening 26 on the side of the semiconductor layer 20 and the insulating layer 28 is covered by the protective film 31 in the front surface side of the semiconductor layer 20.

That is, in the solid-state imaging device 1 of the present embodiment, the insulating layer 29 which is the alignment mark 27 and the insulating layer 28 formed around the opening 26 of the electrode pad forming region 34 are similarly covered by the protective films 30 and 31 in the front surface side of the semiconductor layer 20.

In the following embodiments, the configuration of the insulating layers 28 and 29 and the protective films 30 and 31 covering the insulating layers 28 and 29 of the rear-surface irradiation type solid-state imaging device 1 will be described in detail.

The method of manufacturing the solid-state imaging device according to the first embodiment of the present invention will be described with reference to FIGS. 3 to 9. The manufacturing process of FIGS. 3 to 5 is a process of forming the alignment mark 27 and will be described in parallel with a process of forming an element isolation portion in the pixel region 3 and a process of forming an element isolation portion in the peripheral circuit region. In the present embodiment, as the element isolation portion of the pixel region 3 an element isolation portion (hereinafter, referred to as an Expanding photodiode area Designed for Isolation (EDI)) including an impurity diffusion layer formed in the semiconductor layer and an insulating film (oxide film) formed on the semiconductor layer with a predetermined thickness is configured. As the element isolation portion of the peripheral circuit region an element isolation portion (hereinafter, a Shallow Trench Isolation (STI)) in which an insulating film is formed in a groove formed in the semiconductor layer is configured. In the following description, a region in which the STI is formed is called an STI forming region 36 and a region in which the EDI is formed is described as an EDI forming region 37.

Figure 3A:
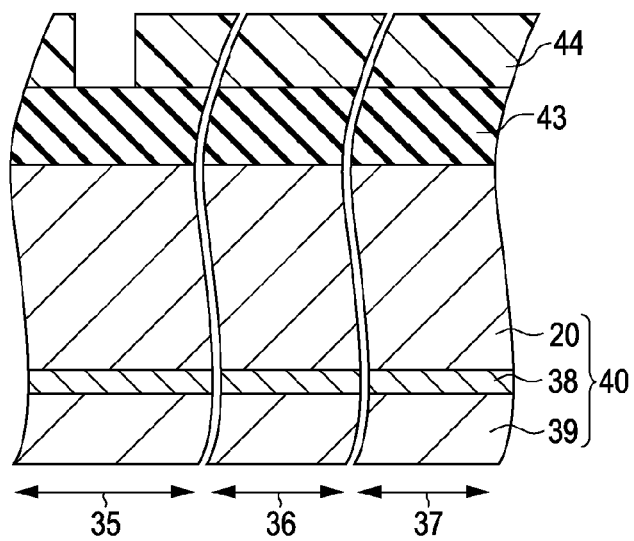
FIGS. 3A to 3C are diagrams showing a method of manufacturing a solid-state imaging device consistent with the present invention.

As shown in FIG. 3A, an SOI substrate 40 in which a buried oxide film (hereinafter, referred to as a BOX layer 38) and the semiconductor layer 20 formed of silicon are sequentially formed on a substrate 39 formed of silicon is prepared. Then, a silicon oxide film 43 and a photoresist film 44 are sequentially formed on the semiconductor layer 20. As shown in FIG. 3A, an opening is formed in the photoresist film 44 in the alignment mark forming region 35.

Figure 3B:
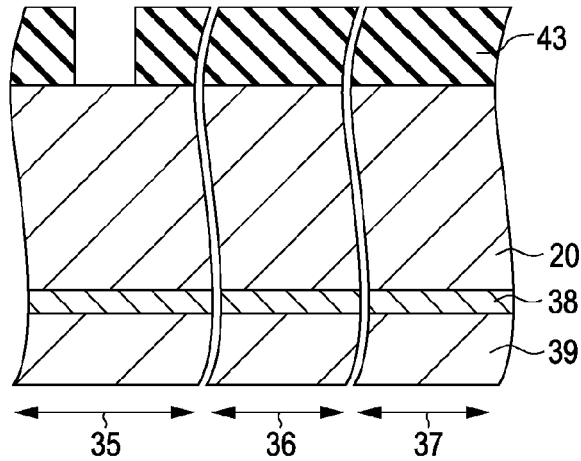

Next, as shown in FIG. 3B, the silicon oxide film 43 is etched using the photoresist film 44 as a mask so as to form an opening for exposing the semiconductor layer 20. The silicon oxide film 43 in which the opening is formed is used as a hard mask for etching the semiconductor layer 20.

Figure 3C:
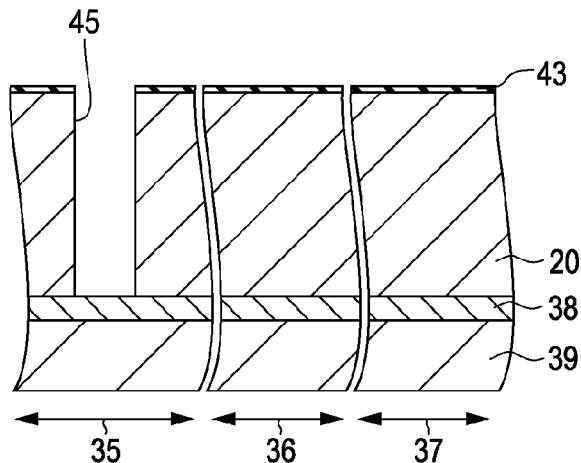

Next, as shown in FIG. 3C, the semiconductor layer 20 is etched using the hard mask formed of the silicon oxide film 43 so as to form an opening 45 in the alignment mark forming region 35. At this time, the silicon oxide film 43 is also thinned. The opening 45 is formed so as to penetrate the semiconductor layer 20. For example, the opening 45 is formed with a width of 70 nm and a depth of 3 μm.

Figure 4D:
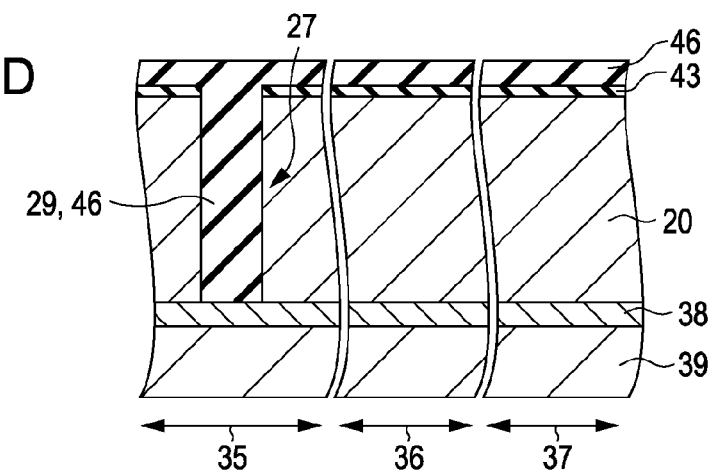
FIGS. 4D to 4F are diagrams showing a method of manufacturing the solid-state imaging device consistent with the present invention.

Next, as shown in FIG. 4D, an insulating layer 46 formed of silicon nitride (SiN) formed so as to be buried in the opening 45 and the insulating layer 46 is formed on the entire surface of the semiconductor layer 20. Thus, the insulating layer 29 is formed in the opening 45 and the alignment mark 27 is formed, in the alignment mark forming region 35.

Although the process progresses to a next process in a state in which the silicon oxide film 43 and the insulating layer 46 are formed on the semiconductor layer 20 in the present embodiment, the insulating layer 46 and the silicon oxide film 43 on the semiconductor layer 20 may be removed one time. In this case, a new silicon oxide film and an insulating layer formed of silicon nitride are formed on the semiconductor layer 20 from which the insulating layer 46 and the silicon oxide film 43 are removed and the process progresses to a next process.

Figure 4E:
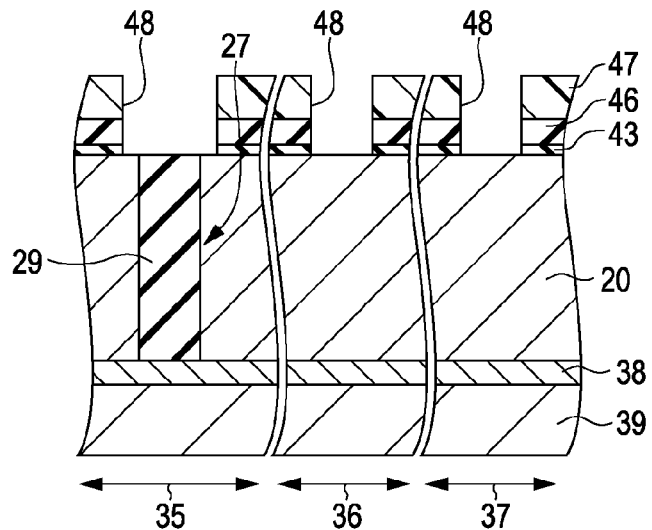

Next, as shown in FIG. 4E, a photoresist film 47 in which openings 48 are formed at desired positions of the alignment mark forming region 35, the STI forming region 36 and the EDI forming region 37 is formed on the insulating layer 46 formed on the semiconductor layer 20. The insulating layer 46 and the silicon oxide film 43 on the semiconductor layer 20 are etched and removed using the photoresist film 47 as a mask. In this case, the opening 48 of the photoresist film 47 in the alignment mark forming region 35 includes a region in which the insulating layer 29 is formed, and is formed such that a region wider than the region in which the insulating layer 29 is formed becomes the opening. Thus, the upper region of the insulating layer 29 is exposed.

Figure 4F:
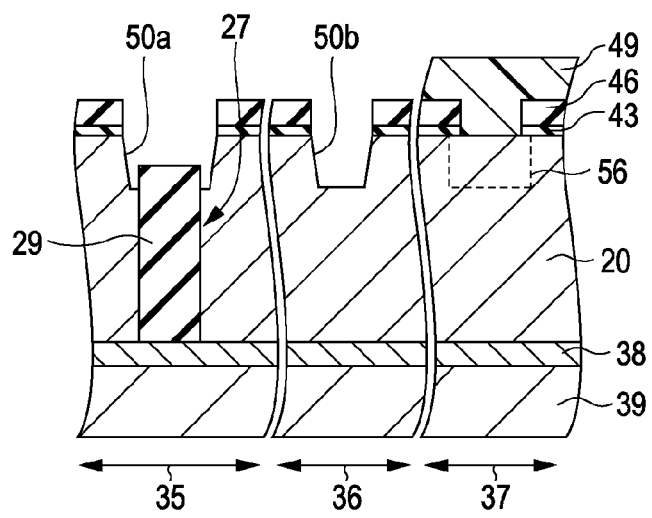

Next, the photoresist film 47 used in the previous process is removed and, as shown in FIG. 4F, a new photoresist film 49 is formed. In the photoresist film 49, openings are formed in the alignment mark forming region 35 and the STI forming region 36 and an opening is not formed in the EDI forming region 37. That is, in the EDI forming region 37, the photoresist film 49 is formed on the entire surface of the insulating layer 46 including the exposed semiconductor layer 20. Thereafter, the semiconductor layer 20 is etched and removed to a predetermined depth using the photoresist film 49 as a mask and using the insulating layer 46 as a hard mask so as to form grooves 50a and 50b. The groove 50b in the STI forming region 36 becomes a trench portion configuring the STI. The groove 50a in the alignment mark forming region 35 is a groove on which the protective film 30 is formed in a subsequent process. In the alignment mark forming region 35, the semiconductor layer 20 around the insulating layer 29 is etched and removed to the same depth (for example, the depth of about 300 nm) as the groove 50b of the STI forming region 36 and the insulating layer 29 is also etched and removed. However, due to an etching rate difference, the insulating layer 29 is held at an upper side of the bottom of the semiconductor layer 20. That is, the insulating layer 29 is not etched to the lower side of the semiconductor layer 20.

After the grooves 50a and 50b are formed, desired impurities are ion-implanted into the surface of the semiconductor layer 20 of the EDI forming region 37 so as to form an impurity diffusion layer configuring the EDI.

Figure 5G:
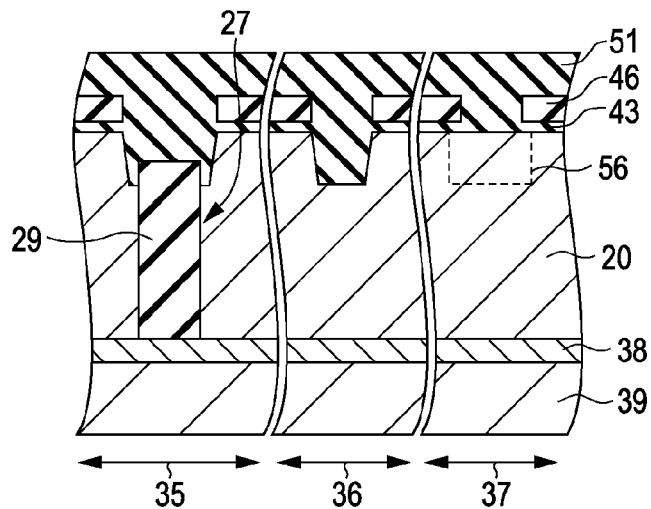
FIGS. 5G to 5I are diagrams showing a method of manufacturing the solid-state imaging device consistent with the present invention.

Next, the photoresist film 49 formed on the insulating layer 46 is removed and, as shown in FIG. 5G, an insulating film 51 formed of SiO is formed on the insulating layer 46 including the grooves 50a and 50b of the semiconductor layer 20. Thus, in the alignment mark forming region 35, the upper portion of the alignment mark 27 formed of the insulating layer 29 is covered by the insulating film 51. In the STI forming region 36, the insulating film 51 is formed in the groove 50b which is the trench portion. In the EDI forming region 37, the insulating film 51 is formed on the semiconductor layer 20 in which the impurity diffusion layer is formed.

Figure 5H:
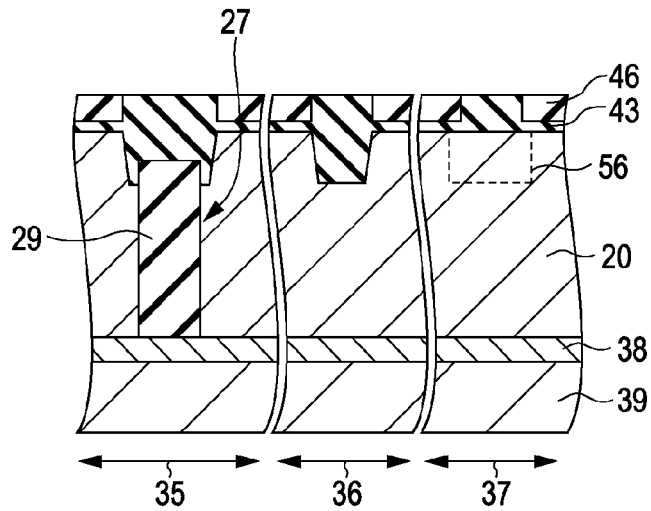

Next, as shown in FIG. 5H, using, for example, a Chemical Mechanical Polishing (CMP) method, the insulating film 51 formed of SiO is removed until the insulating layer 46 formed of SiN on the semiconductor layer 20 is exposed. That is, in the process of polishing the insulating film 51, the insulating layer 46 formed of SiN is used as a stopper.

Figure 5I:
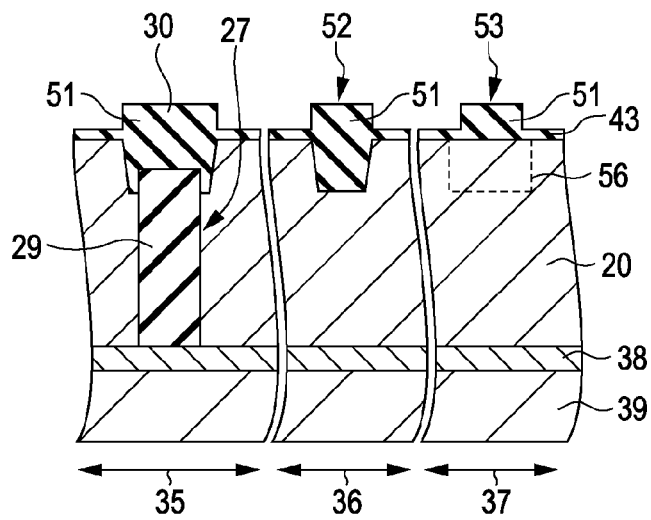

Thereafter, as shown in FIG. 5I, the exposed insulating layer 46 is removed using hot phosphoric acid. Thus, in the alignment mark forming region 35, the upper portion of the insulating layer 29 which is the alignment mark 27 is covered by the protective film 30 formed of the insulating film 51. The STI 52 which is the element isolation portion is formed in the STI forming region 36 and an EDI 53 which is the element isolation portion is formed in the EDI forming region 37. The thickness of the formed protective film 30 or the thickness of the insulating film 51 configuring the EDI 53 follows the thickness of the insulating layer 46 formed on the silicon oxide film 43. In order to maintain the thickness of the protective film 30 or the insulating film 51 of the EDI 53 at about 100 nm, the thickness of the insulating layer 46 formed on the silicon oxide film 43 is preferably about 100 nm.

In the solid-state imaging device of the present embodiment, the groove 50a formed simultaneously with the groove 50b configuring the STI 52 is formed in the semiconductor layer 20 including the upper portion of the insulating layer 29, which is the alignment mark 27, and the protective film 30 formed in the same process as the insulating film 51 configuring the STI 52 is formed. By covering the insulating layer 29 by the protective film 30, it is possible to prevent the insulating layer 29 configuring the alignment mark 27 from being unnecessarily etched in the process of etching and removing the insulating layer 46 formed of SiN.

As a comparative example, the case where an alignment mark 68 is formed by the insulating layer 29 formed of SiN using the method of the related art will be described with reference to FIGS. 6 and 7. Even in the comparative example, the process of forming the alignment mark 68 in the alignment mark forming region 35, the process of forming the STI in the STI forming region 36 and the process of forming the EDI in the EDI forming region 37 will be described in parallel. In FIGS. 6 and 7, the portions corresponding to those of FIGS. 3 to 5 are denoted by the same reference numerals and the description thereof will be omitted.

Figure 6A:
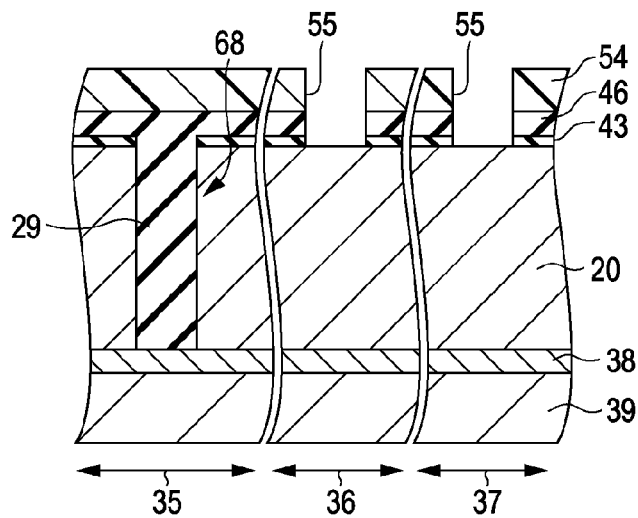
FIGS. 6A to 6C are diagrams showing a method of manufacturing a solid-state imaging device consistent with the present invention.

FIG. 6A is a diagram corresponding to a subsequent process of FIG. 4D of the present embodiment, and the previous process of FIG. 6A is equal to the process of FIGS. 3A to 3C and FIG. 4D and the description thereof will be omitted.

As shown in FIG. 6A, after the insulating layer 46 is formed, a photoresist film 54 in which openings 55 are formed at desired positions of the STI forming region 36 and the EDI forming region 37 is formed on the insulating layer 46 formed on the semiconductor layer 20. That is, an opening is not formed in the alignment mark forming region 35. The insulating layer 46 and the silicon oxide film 43 on the semiconductor layer 20 are etched and removed using the photoresist film 54 as a mask.

Figure 6B:
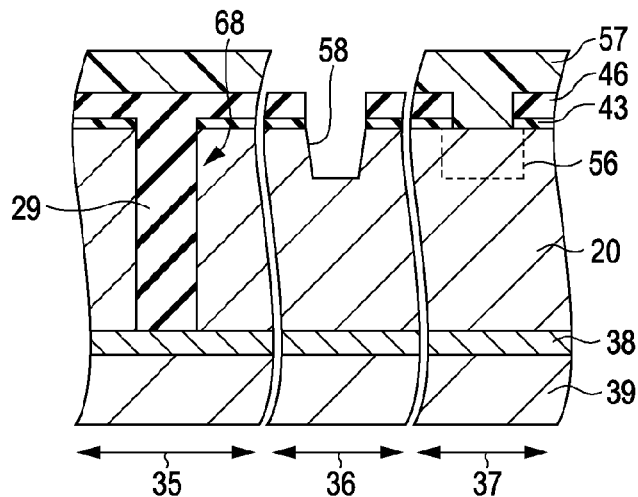

Next, the photoresist film 54 used in the previous process is removed and, as shown in FIG. 6B, a new photoresist film 57 is formed. In the photoresist film 57, an opening is formed in the STI forming region 36 and an opening is not formed in the alignment mark forming region 35 and the EDI forming region 37. That is, the photoresist film 57 is formed on the entire surface of the insulating layer 46 including the exposed semiconductor layer 20 in the alignment mark forming region 35 and the EDI forming region 37. Thereafter, using the photoresist film 57 as a mask and using the insulating layer 46 as a hard mask, the semiconductor layer 20 is etched and removed to a desired depth so as to form a groove 58. The groove 58 becomes a trench portion configuring the STI in the STI forming region 36.

After the groove 58 is formed, desired impurities are ion-implanted into the surface of the semiconductor layer 20 of the EDI forming region 37 so as to form an impurity diffusion layer 56 configuring the EDI.

Figure 6C:
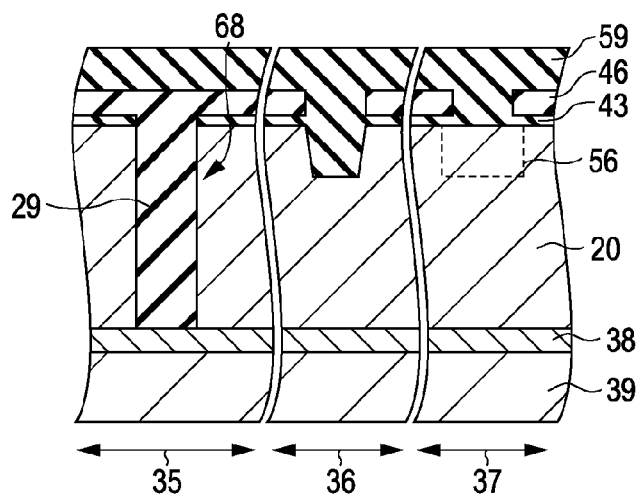

Next, the photoresist film 57 formed on the insulating layer 46 is removed and, as shown in FIG. 6C, an insulating film 59 formed of SiO is formed on the insulating layer 46 including the groove 58 of the semiconductor layer 20.

Figure 7D:
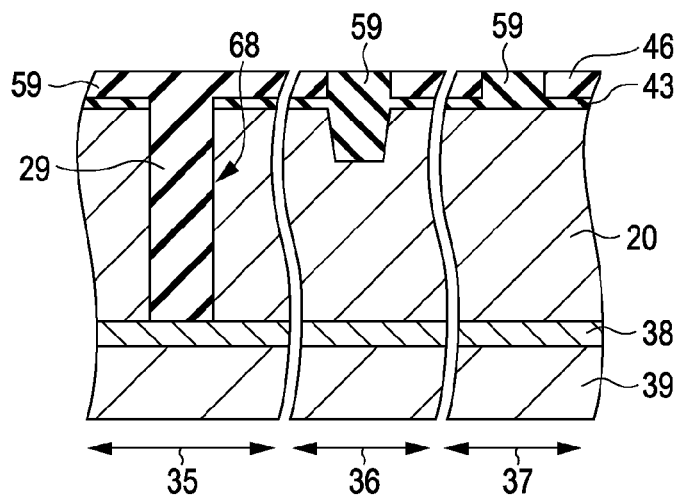
FIGS. 7D and 7E are diagrams showing a method of manufacturing the solid-state imaging device consistent with the present invention.

Next as shown in FIG. 7D, for example, using a CMP method, the insulating film 59 formed of SiO is removed until the insulating layer 46 formed of SiN on the semiconductor layer 20 is exposed.

Figure 7E:
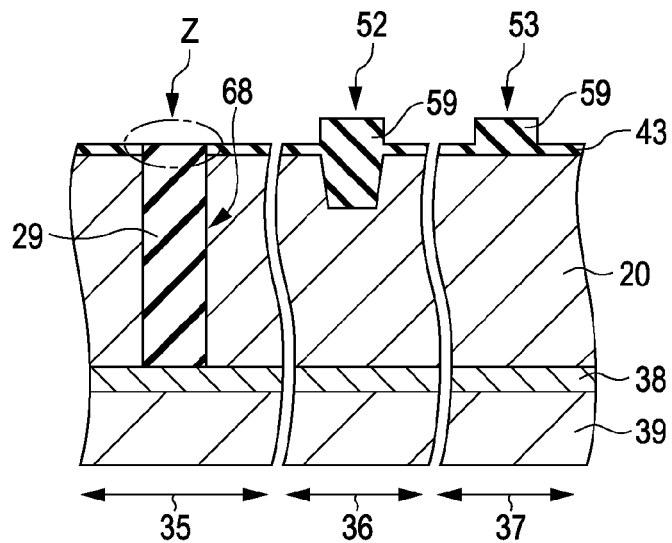

Next, as shown in FIG. 7E, the insulating layer 46 is removed using hot phosphoric acid. Thus, in the STI forming region 36, the insulating film 59 is buried in the groove 58 so as to form an STI 52 which is the element isolation portion. In the EDI forming region 37, the insulating film 59 is formed on the semiconductor layer 20 in which the impurity diffusion layer 56 is formed so as to form an EDI 53 which is the element isolation portion.

Figure 28A:
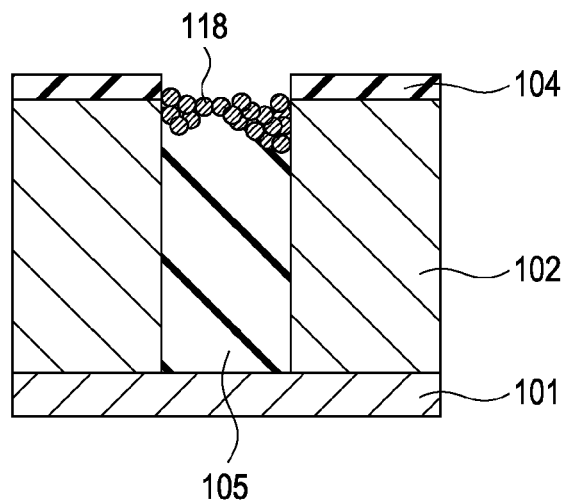
FIGS. 28A and 28B are schematic diagrams showing problems generated in the insulating layer formed by the method of manufacturing the solid-state imaging device of the related art.
Figure 28B:
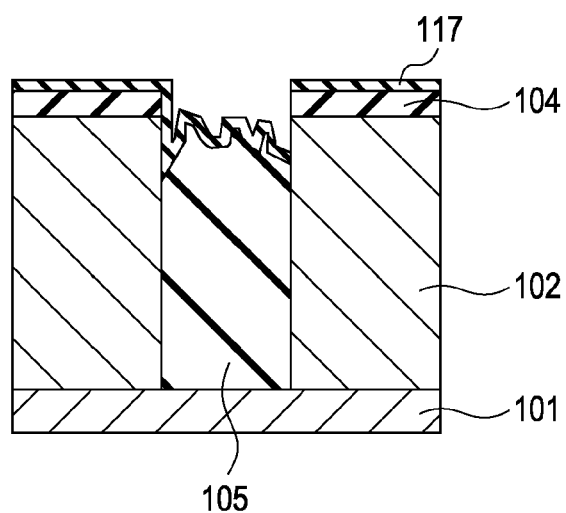

However, in such a comparative example, when the insulating layer 46 formed of SiN is removed, the insulating layer 29 configuring the alignment mark 68 is exposed in the alignment mark forming region 35. Therefore, when the insulating layer 46 on the semiconductor layer 20 is removed, the upper portion, which is denoted by a region Z of FIG. 7E, of the insulating layer 29 configuring the alignment mark 68 is simultaneously etched. Thus, the problems described using FIGS. 28A and 28B occur.

In the solid-state imaging device of the present embodiment, as described above, by covering the insulating layer 29 which is the alignment mark 27 by the protective film 30, it is possible to prevent the insulating layer 29 configuring the alignment mark 27 from being unnecessarily removed. Accordingly, it is possible to prevent the problems of FIGS. 28A and 28B from occurring.

In the solid-state imaging device of the present embodiment, since the protective film 30 can be simultaneously formed in the process of manufacturing the STI 52, the number of processes is not increased.

Although the method of forming the alignment mark 27 is described in the description of FIGS. 3A to 5I, the insulating layer 28 may be formed at the desired position of the semiconductor layer 20 in the electrode pad forming region 34 by the same method as the method of forming the alignment mark 27.

Figure 8:
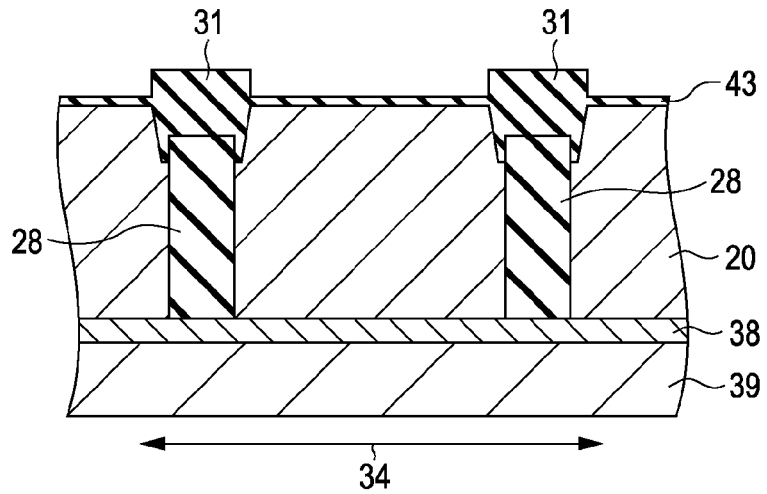
FIG. 8 is a schematic cross-sectional view of an electrode pad forming region of a solid-state imaging device consistent with the present invention.

FIG. 8 is a diagram showing the insulating layer 28 formed in the semiconductor layer 20 of the electrode pad forming region 34 similar to the alignment mark forming region 35, in the present embodiment. In the electrode pad forming region 34, the insulating layer 28 is formed in the semiconductor layer 20 corresponding to a region surrounding the electrode pad 25 formed in the multi-layer wiring layer 21 using the same method as the method of forming the alignment mark 27 of FIGS. 3A to 5I. The insulating layer 28 in the electrode pad forming region 34 surrounds the periphery of the opening 26 formed such that the electrode pad 25 faces the front surface side of the semiconductor layer 20 in a subsequent process. Even in the electrode pad forming region 34, the protective film 31 is formed on the insulating layer 28 using the same method as the method of forming the protective film 30 on the alignment mark 27.

Figure 9A:
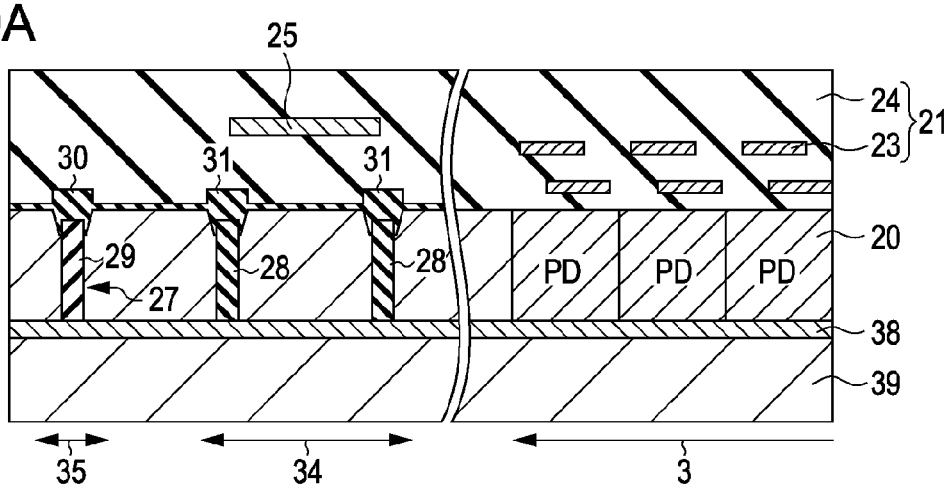
FIGS. 9A to 9C are diagrams showing a method of manufacturing the solid-state imaging device consistent with the present invention.
Figure 9B:
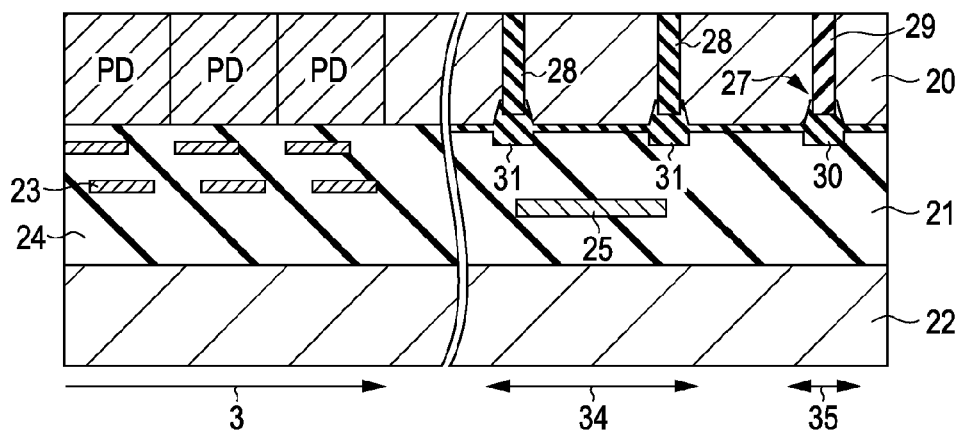
Figure 9C:
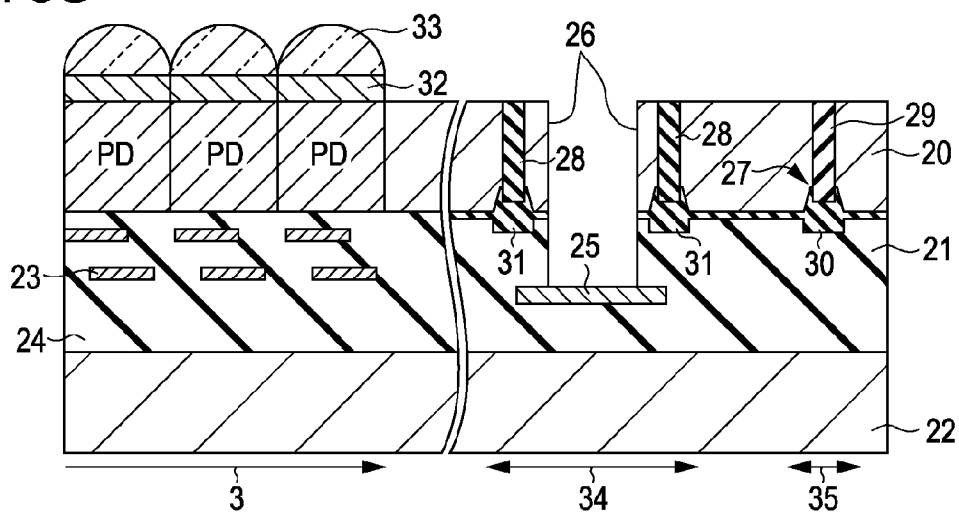

FIGS. 9A to 9C show manufacturing processes after the formation of the photodiodes PD, the pixel transistors (not shown) and the insulating layers 28 and 29 in the semiconductor layer 20 is completed, in the method of manufacturing the solid-state imaging device of the present embodiment.

As shown in FIG. 9A, in addition to the alignment mark 27 or the insulating layer 29 in the electrode pad forming region 34, the photodiodes PD are formed, the pixel transistors (not shown) are formed on the surface of the semiconductor layer 20, and the multi-layer wiring layer 21 is then formed on the semiconductor layer 20. The multi-layer wiring layer 21 is formed by alternately forming the interlayer insulating film 24 and the desired wiring 23. In the electrode pad forming region 34, the electrode pad 25 is formed by a portion of the wiring 23.

After the multi-layer wiring layer 21 is formed on the front surface side of the semiconductor layer 20, the support substrate 22 is adhered on the multi-layer wiring layer 21 and the overall element is reversed as shown in FIG. 9B. Thereafter, the substrate 39 and the BOX layer 38 on the rear surface side of the semiconductor layer 20 are removed until the semiconductor layer 20 is exposed.

Thereafter, as shown in FIG. 9C, an opening 26 is formed in a region surrounded by the insulating layer 28 in the electrode pad forming region 34 so as to expose the electrode pad 25 formed in the multi-layer wiring layer 21. The desired color filter layers 32 and on-chip lenses 33 are formed on the rear surface of the semiconductor layer 20 by positioning using the alignment mark 27.

Therefore, the solid-state imaging device of the present embodiment is completed.

In the solid-state imaging device of the present embodiment, the insulating layer 29 which is the alignment mark 27 or the insulating layer 28 formed in the electrode pad forming region 34 is not etched and removed in the manufacturing process. Thereby improving the yield. In the electrode pad forming region 34, even when a bonding wire or the like connected to the electrode pad 25 is formed in the opening 26, the insulation of the bonding wire or the semiconductor layer 20 is maintained.

The insulating layer 29 which is the alignment mark 27 or the insulating layer 28 formed in the electrode pad forming region 34 is formed in the opening penetrating the semiconductor layer 20 with a high aspect ratio. Even in this case, by using silicon nitride with a good burying property as the insulating layers 28 and 29, it is possible to prevent generation of a void.

By forming the insulating layers 28 and 29 using silicon nitride, it is possible to prevent the insulating layers 28 and 29 from being excessively removed when the element is reversed and the substrate 39 and the BOX layer 38 formed of the buried oxide film configuring the SOI substrate 40 are removed. Thus, it is possible to form the insulating layers 28 and 29 so as to protrude from the rear surface side of the semiconductor layer 20 and to improve visibility of the alignment mark 27.

In the above-described manufacturing method, an example in which the protective films 30 and 31 of the alignment mark 27 and the insulating layer 28 formed in the electrode pad forming region 34 are formed in the same process as the STI 52 used as the element isolation portion of the peripheral circuit region is described. Alternatively, the alignment mark 27 and the insulating layers 28 and 29 formed in the electrode pad forming region 34 may be formed in the same process as the EDI 53 used as the element isolation portion of the pixel region. Hereinafter, an example of forming the alignment mark and the insulating layer simultaneously with the EDI 53 will be described.

The method of manufacturing the solid-state imaging device according to the second embodiment of the present invention will be described with reference to FIGS. 10 to 12. The manufacturing process of FIGS. 10 to 12 is a process of forming the alignment mark 27 similar to the first embodiment and will be described in parallel with a process of forming an element isolation portion (EDI) in the pixel region and a process of forming an element isolation portion (STI) in the peripheral circuit region. In FIGS. 10 to 12, the portions corresponding to those of FIGS. 3A to 5I and 8 are denoted by the same reference numerals and the description thereof will be omitted.

Figure 10A:
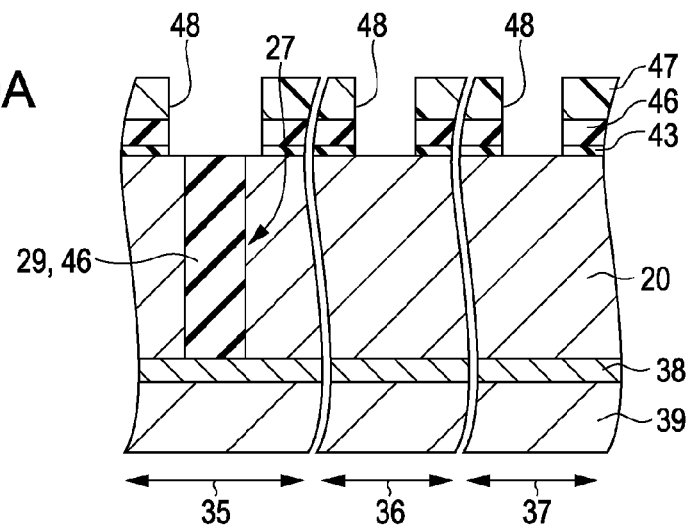
FIGS. 10A to 10C are diagrams showing a method of manufacturing a solid-state imaging device consistent with the present invention.

FIG. 10A is a diagram corresponding to FIG. 4E of the first embodiment. The processes up to FIG. 10A are equal to the processes of FIGS. 3A to 4E and the description thereof will be omitted.

As shown in FIG. 10A, the insulating layer 46 and the silicon oxide film 43 at the desired positions of the alignment mark forming region 35, the STI forming region 36 and the EDI forming region 37 are etched using the photoresist film 47 and the photoresist film 47 is then removed.

Figure 10B:
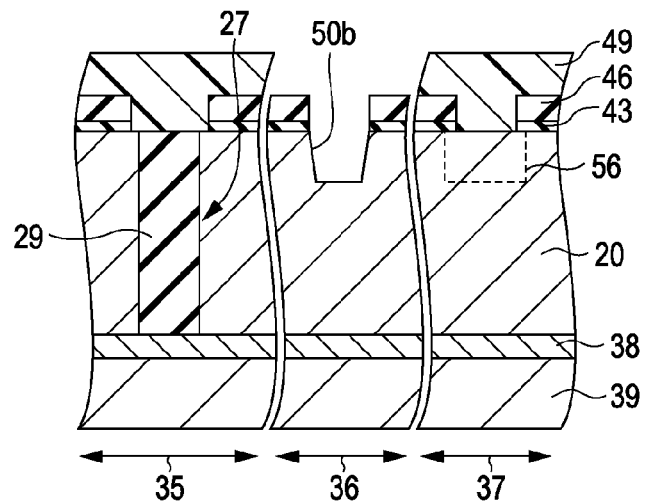

Next, as shown in FIG. 10B, a new photoresist film 49 is formed. In the photoresist film 49, an opening is formed in the STI forming region 36 and an opening is not formed in the alignment mark forming region 35 and the EDI forming region 37. That is, in the alignment mark forming region 35 and the EDI forming region 37, the photoresist film 49 is formed on the entire surface of the insulating layer 46 including the exposed semiconductor layer 20. Thereafter, using the photoresist film 49 as a mask and using the insulating layer 46 as a hard mask, the semiconductor layer 20 is etched and removed to a predetermined depth so as to form a groove 50b in the STI forming region 36. The groove 50b becomes a trench portion configuring the STI.

After the groove 50b is formed, desired impurities are ion-implanted into the surface of the semiconductor layer 20 of the EDI forming region 37 so as to form an impurity diffusion layer 56 configuring the EDI.

Figure 10C:
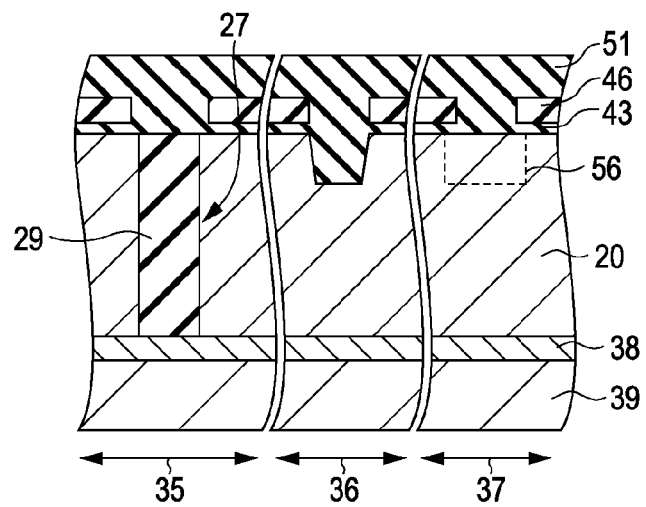

Next, the photoresist film 49 formed on the insulating layer 46 is removed and, as shown in FIG. 10C, an insulating film 51 formed of SiO is formed on the entire surface of the insulating layer 46 including the groove 50b. Thus, in the alignment mark forming region 35, the upper portion of the alignment mark 27 formed of the insulating layer 29 is covered by the insulating film 51. In the STI forming region 36, the insulating film 51 is formed in the groove 50b which is the trench portion. In the EDI forming region 37, the insulating film 51 is formed on the semiconductor layer 20 in which the impurity diffusion layer 56 is formed.

Figure 11D:
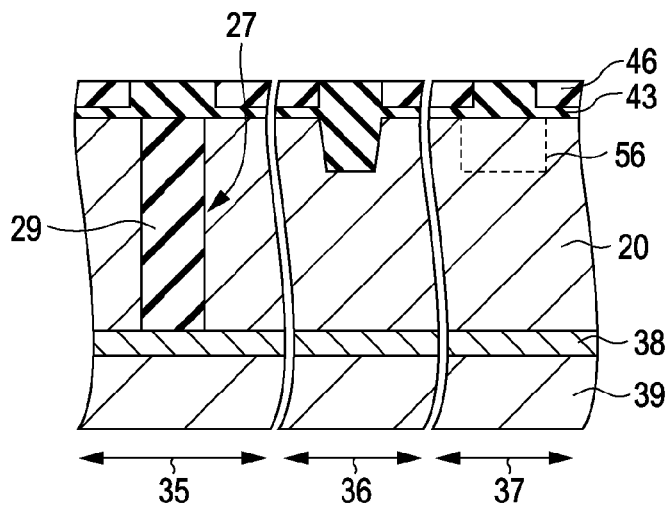
FIGS. 11D and 11E are diagrams showing a method of manufacturing the solid-state imaging device consistent with the present invention.
Figure 12:
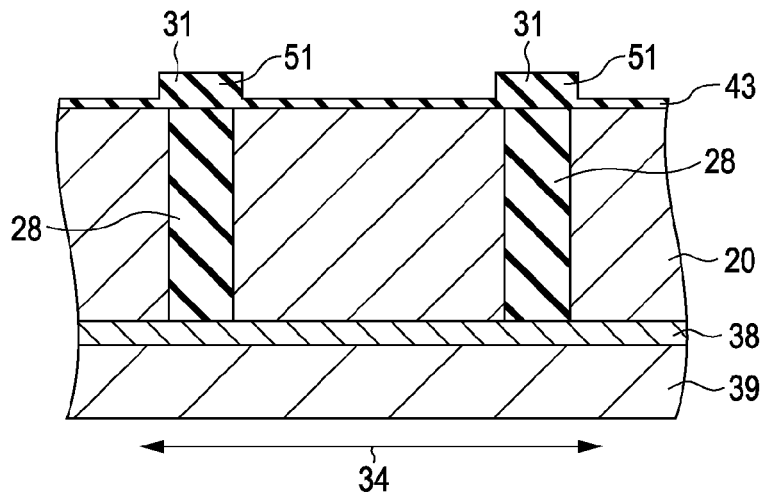
FIG. 12 is a schematic cross-sectional view of an electrode pad forming region of the solid-state imaging device consistent with the present invention.

Next as shown in FIG. 11D, for example, using a CMP method, the insulating film 51 formed of silicon oxide is removed until the insulating layer 46 formed of SiN on the semiconductor layer 20 is exposed.

Figure 11E:
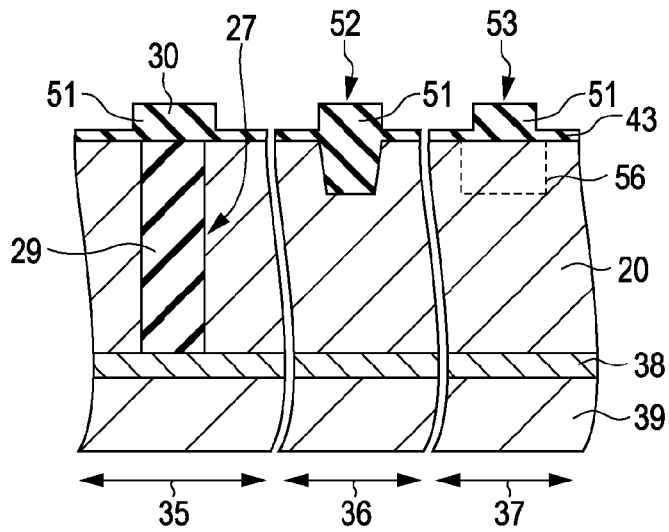

Next, as shown in FIG. 11E, the exposed insulating layer 46 is etched and removed using hot phosphoric acid. Thus, in the alignment mark forming region 35, the upper portion of the insulating layer 29 which is the alignment mark 27 is covered by the protective film 30 formed of the insulating film 51. The STI 52 which is an element isolation portion is formed in the STI forming region 36, and the STI 53 which is an element isolation portion is formed in the EDI forming region 37.

In the solid-state imaging device of the present embodiment, in the alignment mark forming region 35, the upper portion of the insulating layer 28 which is the alignment mark 27 is covered by the protective film 30 formed of the insulating film 51 formed in the same process as the insulating film 51 configuring the EDI 53. Thus, in the process of etching and removing the insulating layer 46 formed of SiN, it is possible to prevent the insulating layer 29 configuring the alignment mark 27 from being unnecessarily etched.

Although the method of forming the alignment mark 27 is described in the description of FIGS. 10A to 11E, even in the present embodiment, the insulating layer 28 around the opening 26 in the electrode pad forming region 34 may be formed using the same method as the method of forming the alignment mark 27.

FIG. 12 is a diagram showing the insulating layer 28 formed in a desired region of the electrode pad forming region 34 similar to the alignment mark forming region 35. In the electrode pad forming region 34, the insulating layer 28 is formed in the semiconductor layer 20 corresponding to a region surrounding the electrode pad 25 formed in the multilayer wiring layer 21 similar to the process of forming the alignment mark 27 of FIGS. 10A to 11E. The insulating layer 28 in the electrode pad forming region 34 surrounds the periphery of the opening 26 formed such that the electrode pad 25 faces the front surface side of the semiconductor layer 20 in a subsequent process. Even in the electrode pad forming region 34, the protective film 31 is formed on the insulating layer 28 similar to the method of forming the protective film 30 on the alignment mark 27.

The solid-state imaging device of the current embodiment is completed in the same processes as FIGS. 9A to 9C. The processes are equal to those of the first embodiment and the description thereof will be omitted.

The same effects as the first embodiment can be obtained in the present embodiment. In the present embodiment, the protective films 30 and 31 formed on the insulating layer 29 which is the alignment mark 27 and the insulating layer 28 formed in the electrode pad forming region 34 can be formed simultaneously with the insulating film 51 configuring the EDI 53. Thus, it is possible to form the protective films 30 and 31 without increasing the number of manufacturing processes.

Although an example in which the insulating layer 29 which is the alignment mark 27 or the insulating layer 29 in the electrode pad forming region 34 is formed of silicon nitride is described in the first and second embodiments, the present invention is not limited thereto. Next, an example in which the configuration of the insulating layer 29 which is the alignment mark 27 and the insulating layer 28 in the electrode pad forming region 34 is different from that of the first and second embodiments will be described.

The method of manufacturing the solid-state imaging device according to the third embodiment of the present invention will be described with reference to FIGS. 13A to 20. The manufacturing process of FIGS. 13A to 15I is a process of forming the alignment mark 27 and will be described in parallel with a process of forming an element isolation portion (EDI) in the pixel region and a process of forming an element isolation portion (STI) in the peripheral circuit region, similarly to the first embodiment. In FIGS. 13A to 20, the portions corresponding to those of FIGS. 3 to 9 are denoted by the same reference numerals and the description thereof will be omitted.

Figure 13A:
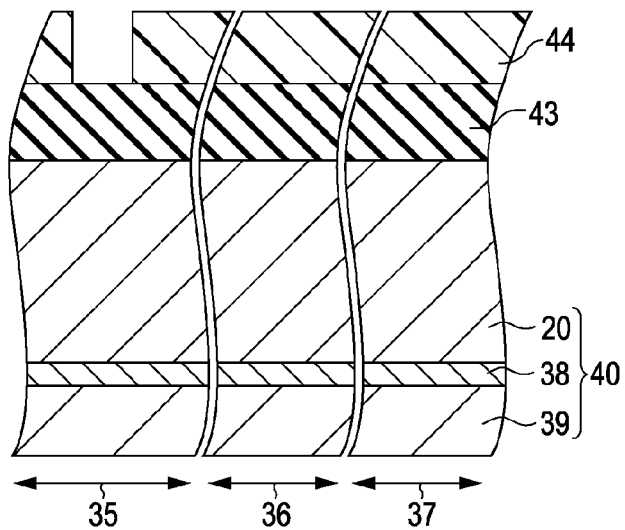
FIGS. 13A to 13C are diagrams showing a method of manufacturing a solid-state imaging device consistent with the present invention.

As shown in FIG. 13A, an SOI substrate 40 in which a buried oxide film (hereinafter, referred to as a BOX layer 38) and the semiconductor layer 20 formed of silicon are sequentially formed on a substrate 39 formed of silicon is prepared. Then, a silicon oxide film 43 and a photoresist film 44 are sequentially formed on the semiconductor layer 20. As shown in FIG. 13A, an opening is formed in the photoresist film 44 in the alignment mark forming region 35.

Figure 13B:
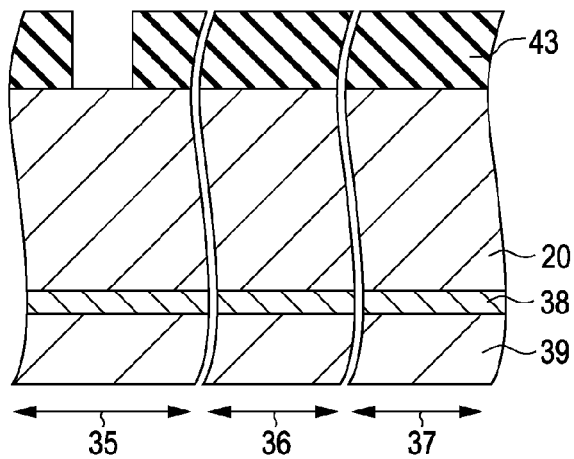

Next, as shown in FIG. 13B, the silicon oxide film 43 is etched using the photoresist film 44 as a mask so as to form an opening for exposing the semiconductor layer 20. The silicon oxide film 43 in which the opening is formed is used as a hard mask for etching the semiconductor layer 20.

Figure 13C:
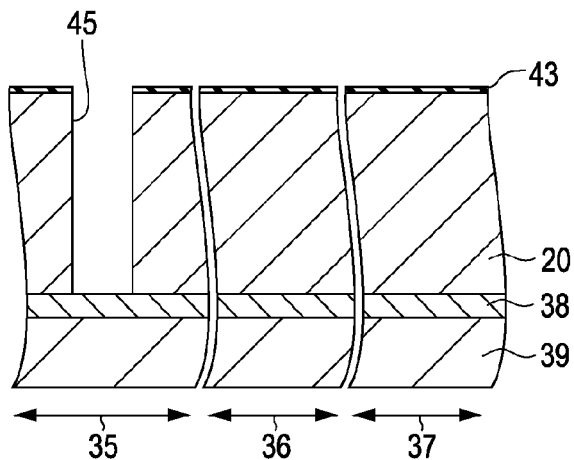

Next, as shown in FIG. 13C, the semiconductor layer 20 is etched using the hard mask formed of the silicon oxide film 43 so as to form an opening 45 in the alignment mark forming region 35. The opening 45 is formed so as to penetrate the semiconductor layer 20. At this time, the silicon oxide film 43 is also thinned.

Figure 14D:
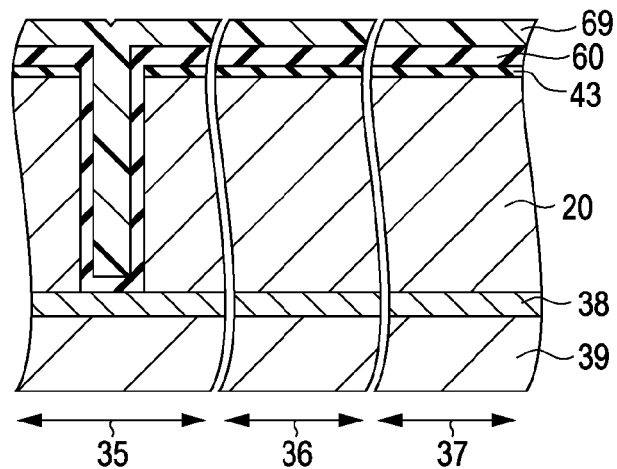
FIGS. 14D to 14F are diagrams showing a method of manufacturing the solid-state imaging device consistent with the present invention.

Next, as shown in FIG. 14D, a first buried film 60 formed of silicon nitride SiN is formed on a sidewall and a bottom of the opening 45 and is formed on the entire surface of the semiconductor layer 20. In FIG. 14D, the silicon nitride film 42 formed in the previous process and the first buried film 60 formed in FIG. 14D are described as the same layer. Thereafter, a second buried film 69 formed of polysilicon is formed to be buried in the opening 45 having the first buried film 60 formed on the sidewall and the bottom thereof and the second buried film 69 is formed on the entire surface of the first buried film 60 formed on the semiconductor layer 20.

Figure 14E:
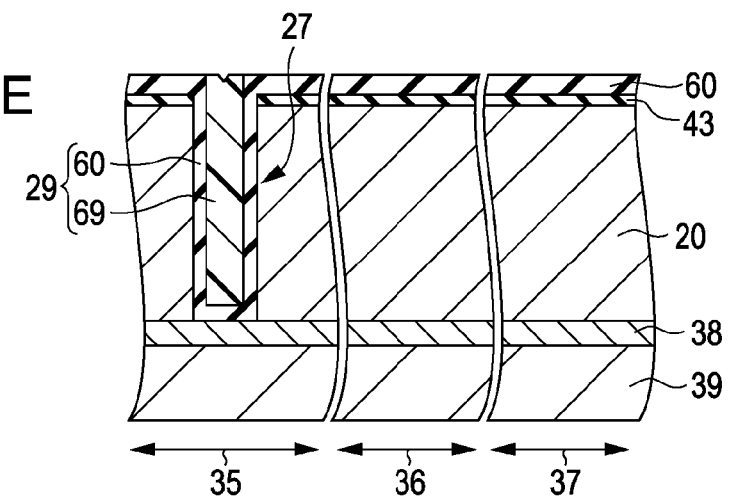

Next, as shown in FIG. 14E, the second buried film 69 formed on the first buried film 60 on the semiconductor layer 20 is etched and removed until the first buried film 60 is exposed.

In the alignment mark forming region 35, since the first buried film 60 formed of silicon nitride which is an insulating material is formed on the sidewall and the bottom of the opening 45, insulation with the semiconductor layer 20 is maintained. That is, the first buried film 60 and the second buried film 69 formed on the opening 45 function as an insulating layer 29.

Thus, the insulating layer 29 including the first buried film 60 formed of silicon nitride which is the insulating material and the second buried film 69 formed of polysilicon is formed on the opening 45 in the alignment mark forming region 35 and thus the insulating layer 29 becomes the alignment mark 27.

Figure 14F:
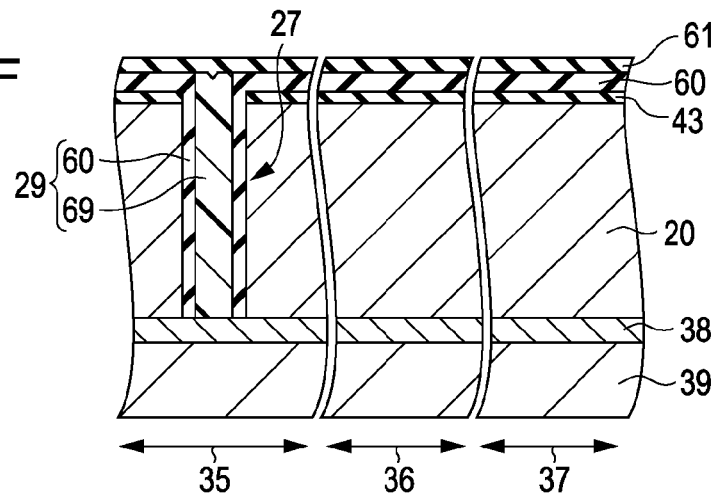

Next, as shown in FIG. 14F, a stopper film 61 formed of SiN is formed on the entire surface including the first buried film 60 and the alignment mark 27 formed on the semiconductor layer 20. The stopper film 61 is used as a stopper at the time of polishing in the CMP used in a subsequent process.

Figure 15G:
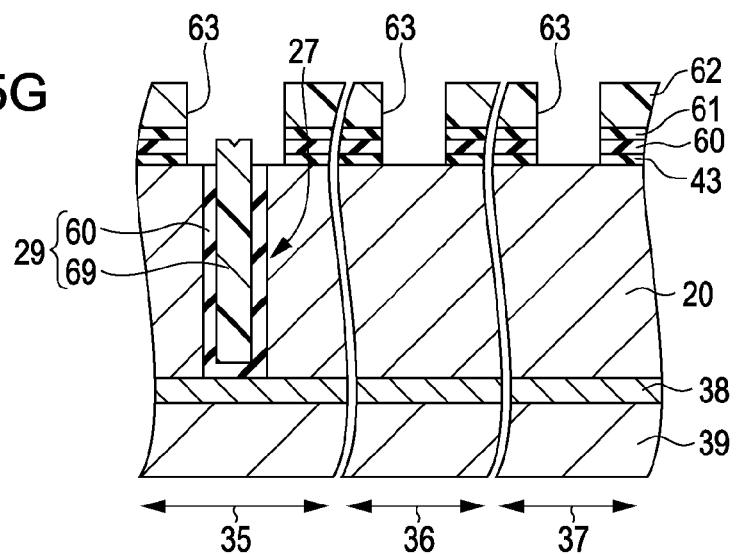
FIGS. 15G to 15I are diagrams showing a method of manufacturing the solid-state imaging device consistent with the present invention.

Next, as shown in FIG. 15G, a photoresist film 62 in which openings 63 are formed at desired positions of the alignment mark forming region 35, the STI forming region 36 and the EDI forming region 37 is formed on the stopper film 61 formed on the semiconductor layer 20. Then, the stopper film 61, the first buried film 60 and the silicon oxide film 43 on the semiconductor layer 20 are etched and removed using the photoresist film 62 as a mask. In this case, the opening 63 of the photoresist film 62 in the alignment mark forming region 35 includes a region in which the insulating layer 29 that becomes alignment mark 27 is formed, and is formed such that a region wider than the region in which the insulating layer 29 is formed becomes the opening. Thus, the upper region of the insulating layer 29 is exposed.

Figure 15H:
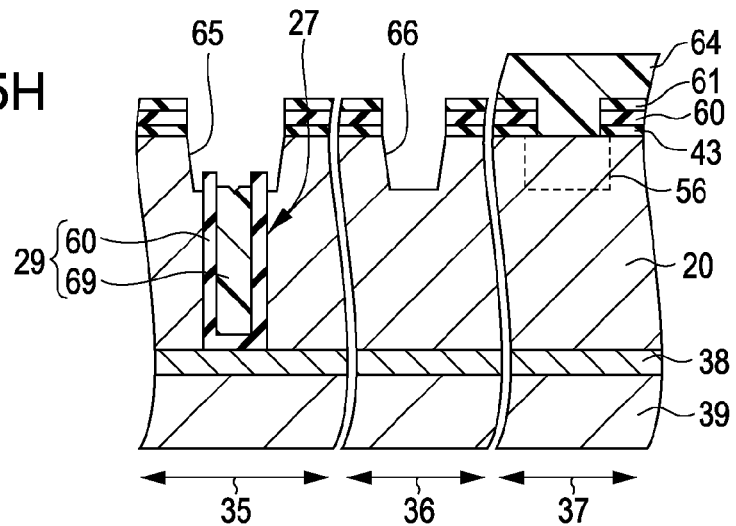

Next, the photoresist film 62 used in the previous process is removed and, as shown in FIG. 15H, a new photoresist film 64 is formed. In the photoresist film 64, openings are formed in the alignment mark forming region 35 and the STI forming region 36 and an opening is not formed in the EDI forming region 37. That is, in the EDI forming region 37, the photoresist film 64 is formed on the entire surface of the stopper film 61 including the exposed semiconductor layer 20. Thereafter, the semiconductor layer 20 is etched and removed to a predetermined depth using the photoresist film 64 as a mask and using the first buried film 60 and the stopper film 61 as a hard mask so as to form grooves 65 and 66. The groove 66 in the STI forming region 36 becomes a trench portion configuring the STI. The groove 65 in the alignment mark forming region 35 is a groove on which the protective film 30 is formed in a subsequent process. In the alignment mark forming region 35, the semiconductor layer 20 around the insulating layer 29 is etched and removed to the same depth as the groove 66 of the STI forming region 36 and the insulating layer 29 is also etched and removed. However, due to an etching rate difference, the insulating layer 29 is held at an upper side of the bottom of the semiconductor layer 20. That is, the insulating layer 29 is not etched to the lower side of the semiconductor layer 20.

After the grooves 65 and 66 are formed, desired impurities are ion-implanted into the surface of the semiconductor layer 20 of the EDI forming region 37 so as to form an impurity diffusion layer 56 configuring the EDI.

Figure 15I:
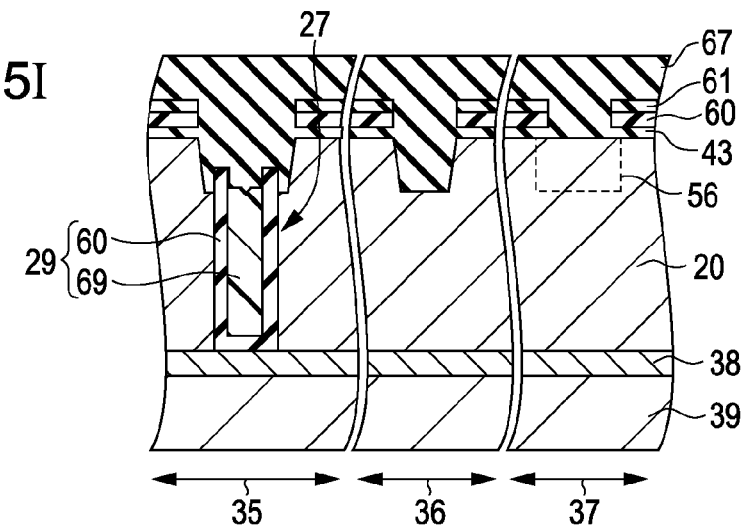

Next, the photoresist film 64 formed on the stopper film 61 is removed and, as shown in FIG. 15I, an insulating film 67 formed of SiO is formed on the stopper film 61 including the grooves 65 and 66 of the semiconductor layer 20. Thus, in the alignment mark forming region 35, the upper portion of the alignment mark 27 formed of the insulating layer 29 is covered by the insulating film 67. In the STI forming region 36, the insulating film 67 is formed in the groove 66 which is the trench portion. In the EDI forming region 37, the insulating film 67 is formed on the semiconductor layer 20 in which the impurity diffusion layer 56 is formed.

Figure 16J:
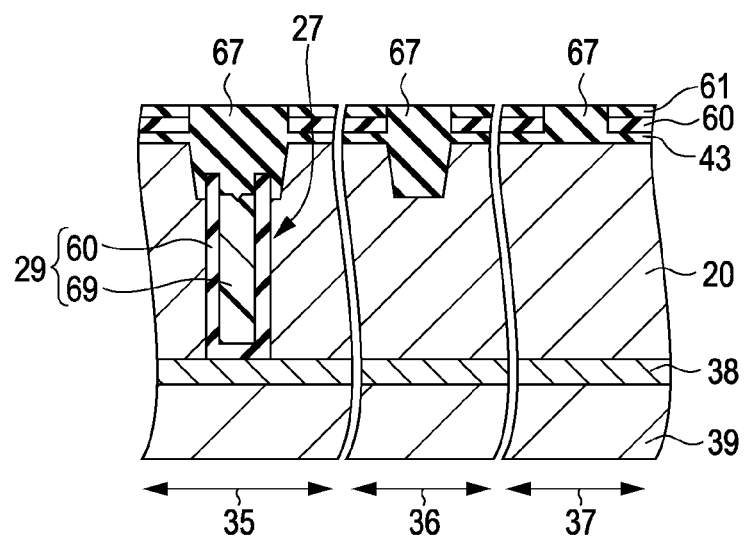
FIGS. 16J and 16K are diagrams showing a method of manufacturing the solid-state imaging device consistent with the present invention.

Next, as shown in FIG. 16J, using, for example, a CMP method, the insulating film 67 formed of SiO is removed until the stopper film 61 formed of SiN on the semiconductor layer 20 is exposed.

Figure 16K:
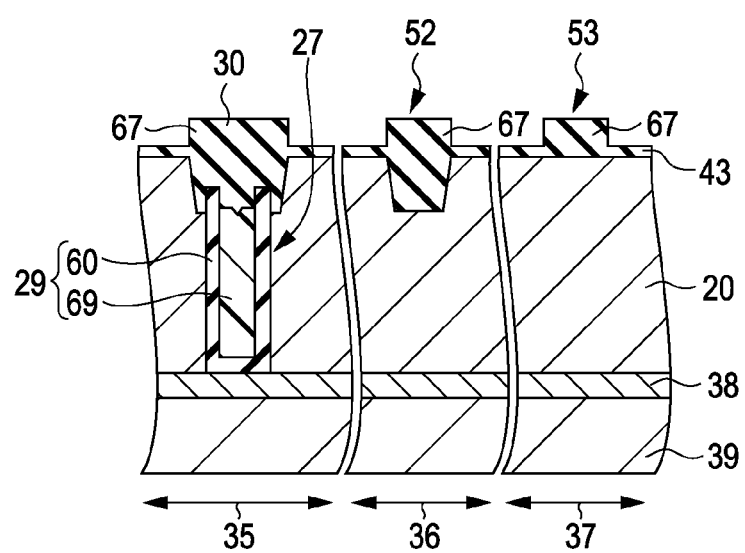

Thereafter, as shown in FIG. 16K, the stopper film 61 and the first buried film 60 are removed using hot phosphoric acid. Thus, in the alignment mark forming region 35, the upper portion of the insulating layer 29 which is the alignment mark 27 is covered by the protective film 30 formed of the insulating film 67. The STI 52 which is the element isolation portion is formed in the STI forming region 36 and an EDI 53 which is the element isolation portion is formed in the EDI forming region 37. The thickness of the formed protective film 30 or the thickness of the insulating film 67 configuring the EDI 53 follows the thickness of the first buried film 60 and the stopper film 61 formed on the silicon oxide film 43. In order to maintain the thickness of the protective film 30 or the insulating film 67 of the EDI 53 at about 100 nm, the thickness of the first buried film 60 and the stopper film 61 formed on the silicon oxide film 43 is preferably about 100 nm.

In the solid-state imaging device of the present embodiment, the groove 65 formed simultaneously with the groove 66 configuring the STI 52 on the insulating layer 29 is formed in the alignment mark forming region 35, and the protective film 30 formed simultaneously with the insulating film 67 configuring the STI 52 is formed in the groove 65. In the process of etching and removing the stopper film 61 formed of SiN and the first buried film 60, it is possible to prevent the first buried film 60 of the insulating layer 29 configuring the alignment mark 27 from being unnecessarily etched.

As a comparative example, the case where an alignment mark 27 is formed by the insulating layer 29 formed of the first buried film 60 and the second buried film 69 using the method of the related art will be described with reference to FIGS. 17A to 18D. Even in the comparative example, the process of forming the alignment mark 27 in the alignment mark forming region 35, the process of forming the STI 52 in the STI forming region 36 and the process of forming the EDI 53 in the EDI forming region 37 will be described in parallel. In FIGS. 17A to 18D, the portions corresponding to those of FIGS. 13A to 16K are denoted by the same reference numerals and the description thereof will be omitted.

Figure 17A:
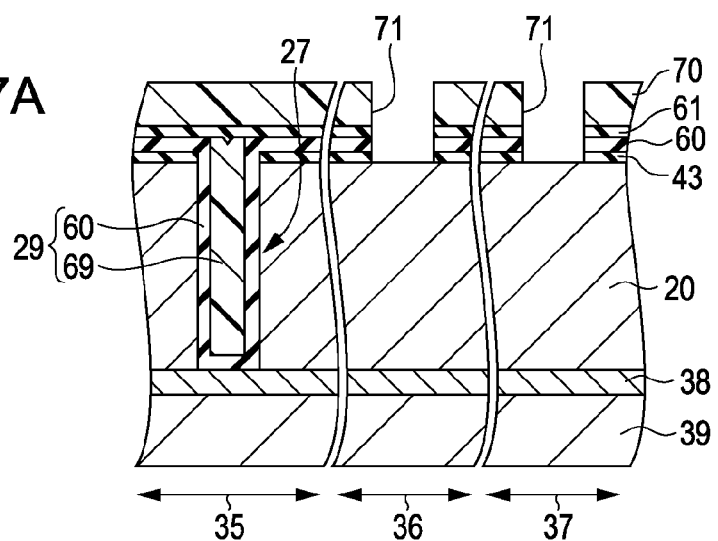
FIGS. 17A to 17C are diagrams showing a method of manufacturing a solid-state imaging device consistent with the present invention.

In a comparative example, as shown in FIG. 17A, after the stopper film 61 is formed, a photoresist film 70 in which openings 71 are formed at desired positions of the STI forming region 36 and the EDI forming region 37 is formed on the stopper film 61. That is, an opening is not formed in the alignment mark forming region 35. The first buried film 60, the stopper film 61 and the silicon oxide film 43 on the semiconductor layer 20 are etched and removed using the photoresist film 70 as a mask.

Figure 17B:
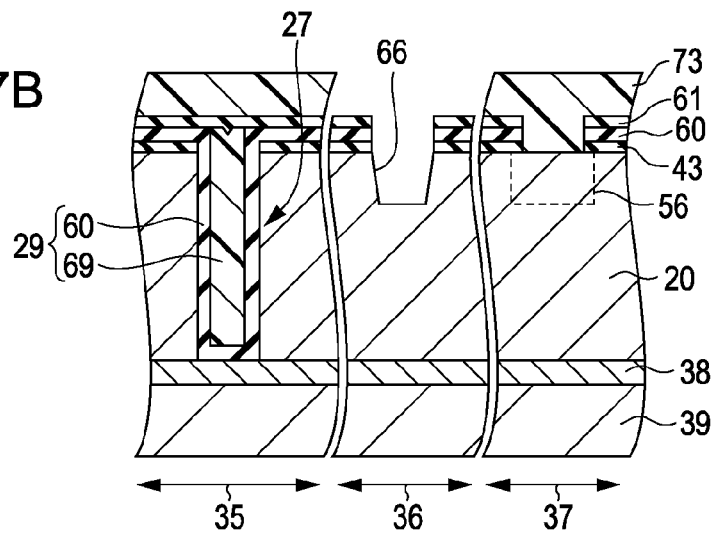

Next, the photoresist film 70 used in the previous process is removed and, as shown in FIG. 17B, a new photoresist film 73 is formed. In the photoresist film 73, an opening is formed in the STI forming region 36 and an opening is not formed in the alignment mark forming region 35 and the EDI forming region 37. That is, the photoresist film 73 is formed on the entire surface of the stopper film 61 including the exposed semiconductor layer 20 in the alignment mark forming region 35 and the EDI forming region 37. Thereafter, using the photoresist film 73 as a mask and using the buried film 60 and the stopper film 61 as a hard mask, the semiconductor layer 20 is etched and removed to a desired depth so as to form a groove 66 in the STI forming region 36. The groove 66 becomes a trench portion configuring the STI. Thereafter, an impurity diffusion layer 56 configuring the EDI is formed on the front surface side of the semiconductor layer 20 of the EDI forming region 37.

Figure 17C:
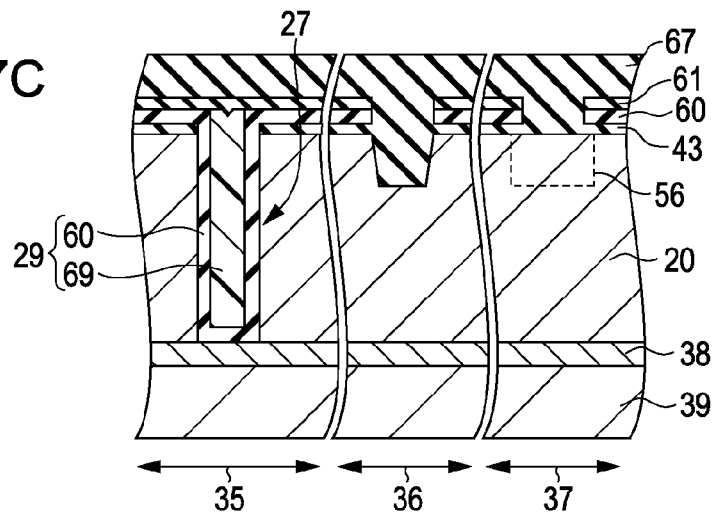

Next, the photoresist film 73 formed on the stopper film 61 is removed and, as shown in FIG. 17C, an insulating film 67 formed of SiO is formed on the stopper film 61 including the groove 66 formed in the semiconductor layer 20.

Figure 18D:
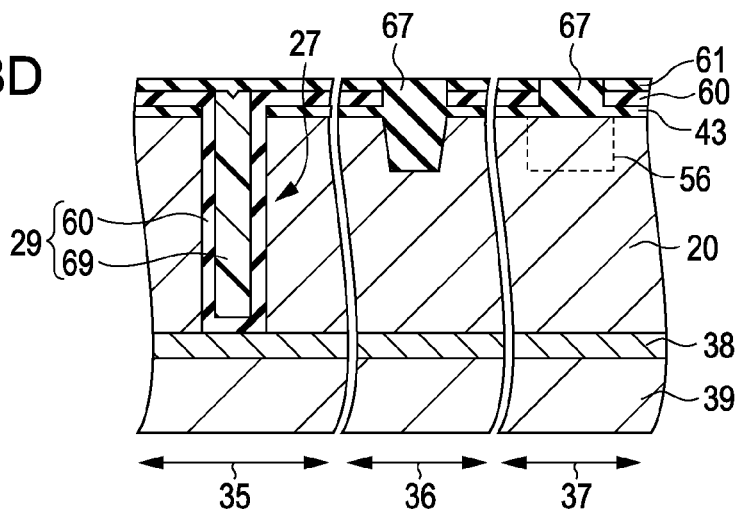
FIGS. 18D and 18E are diagrams showing a method of manufacturing the solid-state imaging device consistent with the present invention.
Figure 18E:
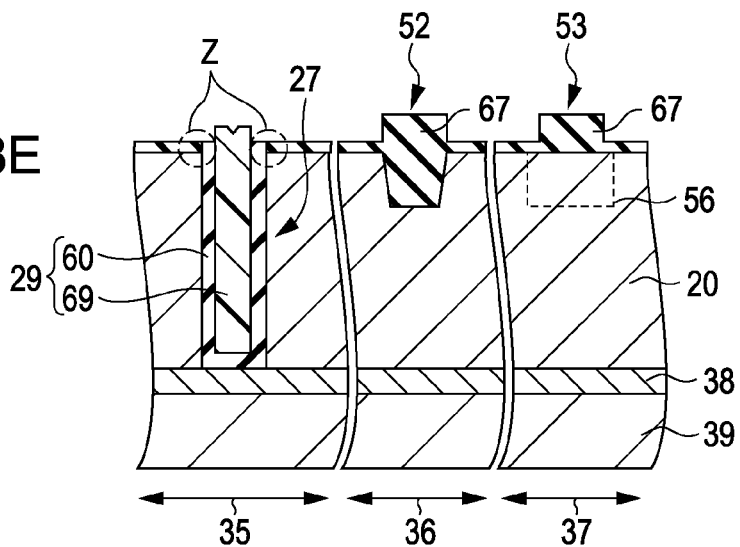

Next as shown in FIG. 18D, for example, using a CMP method, the insulating film 67 formed of SiO is removed until the stopper film 61 formed of SiN on the semiconductor layer 20 is exposed.

Next, as shown in FIG. 18D, the stopper film 61 formed of silicon nitride and the first buried film 60 are removed using hot phosphoric acid. Thus, in the STI forming region 36, the insulating film 67 is buried in the groove 66 so as to form an STI 52 which is the element isolation portion. In the EDI forming region 37, the insulating film 67 is formed on the semiconductor layer 20 in which the impurity diffusion layer 56 is formed so as to form an EDI 53 which is the element isolation portion.

However, in such a comparative example, when the stopper film 61 and the first buried film 60 are removed using hot phosphoric acid, the first buried film 60 configuring the alignment mark 27 is exposed in the alignment mark forming region 35. Therefore, when the stopper film 61 and the first buried film 60 on the semiconductor layer 20 are removed, the upper portion, which is denoted by a region z, of the first buried film 60 configuring the alignment mark 27 is simultaneously etched. Thus, the problems described using FIGS. 28A and 28B occur.

In the solid-state imaging device of the present embodiment, as described above, by covering the insulating layer 29 which is the alignment mark 27 by the protective film 30, it is possible to prevent the insulating layer 29 configuring the alignment mark 27 from being unnecessarily removed. Accordingly, it is possible to prevent the problems of FIGS. 28A and 28B from occurring.

In the solid-state imaging device of the present embodiment, since the protective film 30 can be simultaneously formed in the process of manufacturing the STI 52, the number of processes is not increased.

Although the method of forming the alignment mark 27 is described in the description of FIGS. 13A to 16K, the insulating layer 28 around the opening 26 in the electrode pad forming region 34 may be formed by the same method as the method of forming the alignment mark 27.

Figure 19:
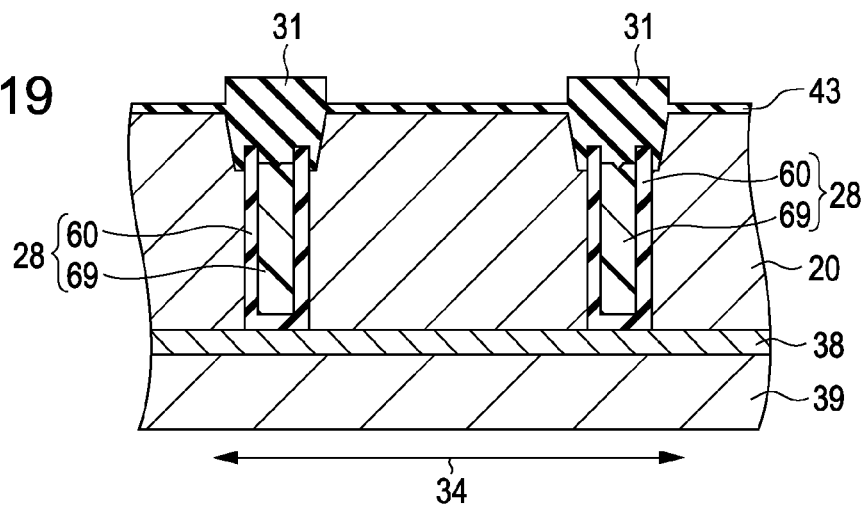
FIG. 19 is a schematic cross-sectional view of an electrode pad forming region of the solid-state imaging device consistent with the present invention.

FIG. 19 is a diagram showing the insulating layer 28 formed in a desired region of the electrode pad forming region 34 similar to the insulating layer 29 formed in the alignment mark forming region 35, in the present embodiment. In the electrode pad forming region 34, the insulating layer 28 is formed in the semiconductor layer 20 corresponding to a region surrounding the electrode pad 25 formed in the multi-layer wiring layer 21 using the same method as the method of forming the alignment mark 27 of FIGS. 13A to 16K. The insulating layer 28 in the electrode pad forming region 34 surrounds the periphery of the opening 26 formed such that the electrode pad 25 faces the front surface side of the semiconductor layer 20 in a subsequent process. Even in the electrode pad forming region 34, the protective film 31 is formed on the insulating layer 28 using the same method as the method of forming the protective film 30 on the alignment mark 27.

Figure 20A:
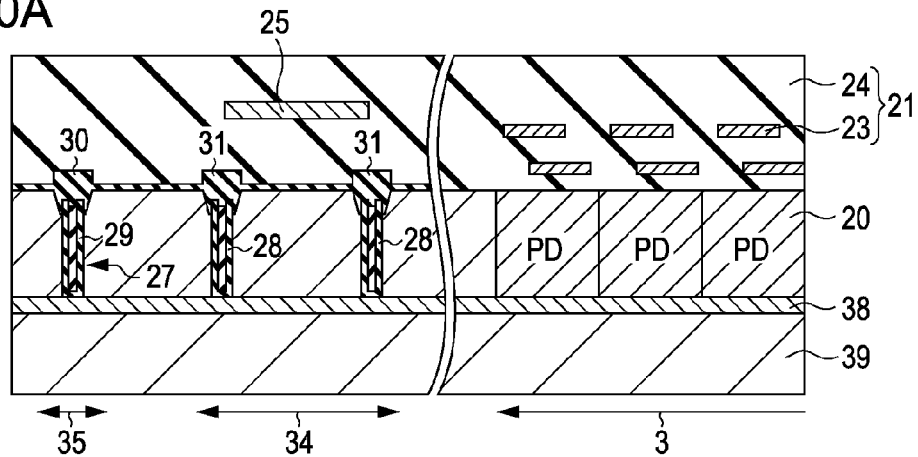
FIGS. 20A to 20C are diagrams showing a method of manufacturing a solid-state imaging device consistent with the present invention.
Figure 20B:
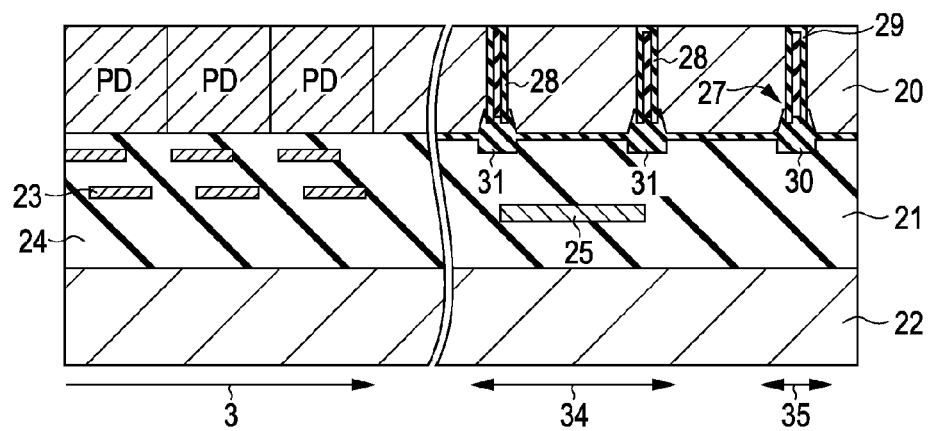
Figure 20C:
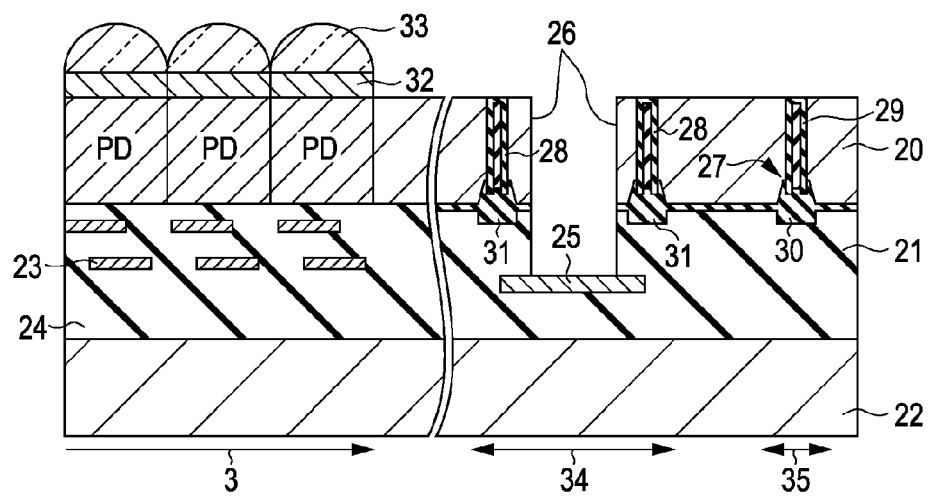

FIGS. 20A to 20C show manufacturing processes after the formation of the photodiodes PD, the pixel transistors (not shown) and the insulating layers 28 and 29 in the semiconductor layer 20 is completed, in the method of manufacturing the solid-state imaging device of the present embodiment.

As shown in FIG. 20A, in addition to the alignment mark 27 or the insulating layer 28 in the electrode pad forming region 34, the photodiodes PD are formed, the pixel transistors (not shown) are formed on the surface of the semiconductor layer 20, and the multi-layer wiring layer 21 is then formed on the semiconductor layer 20. The multi-layer wiring layer 21 is formed by alternately forming the interlayer insulating film 24 and the desired wiring 23. In the electrode pad forming region 34, the electrode pad 25 is formed by a portion of the wiring 23.

After the multi-layer wiring layer 21 is formed on the front surface side of the semiconductor layer 20, the support substrate 22 is adhered on the multi-layer wiring layer 21 and the overall element is reversed as shown in FIG. 20B. Thereafter, the substrate 39 and the BOX layer 38 on the rear surface side of the semiconductor layer 20 are removed until the semiconductor layer 20 is exposed.

Thereafter, as shown in FIG. 20C, an opening 26 is formed in a region surrounded by the insulating layer 28 in the electrode pad forming region 34 so as to expose the electrode pad 25 formed in the multi-layer wiring layer 21. The desired color filter layers 32 and on-chip lenses 33 are formed on the rear surface of the semiconductor layer 20 by positioning using the alignment mark 27.

Therefore, the solid-state imaging device of the present embodiment is completed.

In the solid-state imaging device of the present embodiment, since the protective films 30 and 31 are formed, the insulating layer 29 which is the alignment mark 27 or the insulating layer 28 formed in the electrode pad forming region 34 is not etched and removed in the manufacturing process. Thus, insulation between the insulating layers 28 and 29 and the semiconductor layer 20 is maintained. Accordingly, in the electrode pad forming region 34, even when a bonding wire or the like which is an external wiring is formed in the opening 26, the short circuit of the external wiring or the semiconductor layer 20 is not generated.

In the present embodiment, since silicon nitride with a good burying property is used as the first buried film 60 buried in the opening 26, it is possible to prevent generation of a void. In addition, since the film formation speed of polysilicon used as the second buried film 69 is greater than that of SiN, throughput is improved. Since the first buried film 60 is formed of silicon nitride, when the element is reversed and the substrate 39 and the BOX layer 38 configuring the SOI substrate 40 are removed, it is possible to prevent the insulating layers 28 and 29 from being excessively removed.

In the above manufacturing method, an example of forming the protective films 30 and 31 of the alignment mark 27 and the insulating layer 28 formed in the electrode pad forming region 34 in the same process as the STI 52 used as the element isolation portion of the peripheral circuit region is shown. Alternatively, the alignment mark 27 and the insulating layers 28 and 29 formed in the electrode pad forming region 34 may be formed in the same process as the EDI used as the element isolation portion of the pixel region. Hereinafter, an example of forming the alignment mark and the insulating layer simultaneously with the EDI will be described.

The method of manufacturing the solid-state imaging device according to a fourth embodiment of the present invention will be described with reference to FIGS. 21 to 23. The manufacturing process of FIGS. 21 to 23 is a process of forming the alignment mark 27 similar to the first to third embodiments and will be described in parallel with a process of forming an element isolation portion (EDI) in the pixel region and a process of forming an element isolation portion (STI) in the peripheral circuit region. In FIGS. 21 to 23, the portions corresponding to those of FIGS. 13A to 16K are denoted by the same reference numerals and the description thereof will be omitted.

Figure 21A:
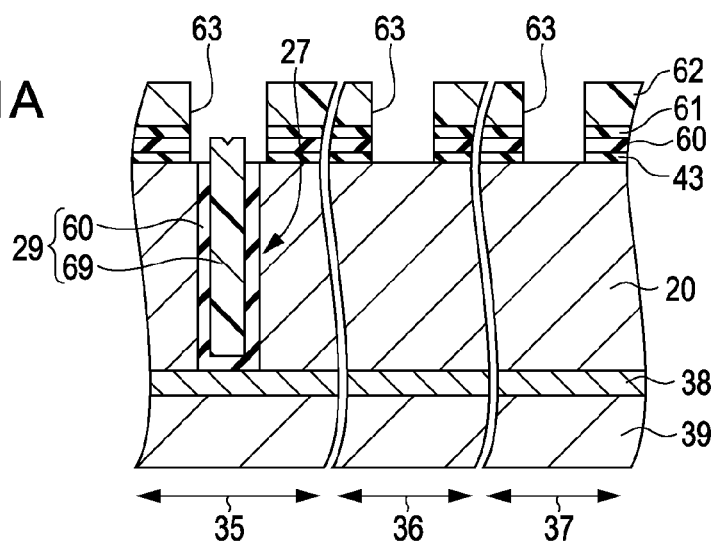
FIGS. 21A to 21C are diagrams showing a method of manufacturing a solid-state imaging device consistent with the present invention.

The processes up to FIG. 21A are similar to the processes of FIGS. 13A to 15G of the third embodiment and the description thereof will be omitted.

As shown in FIG. 21A, the silicon oxide film 43, the first buried film 60 and the stopper film 61 of the desired positions are removed using a photoresist film 62 and the photoresist film 62 is then removed.

Figure 21B:
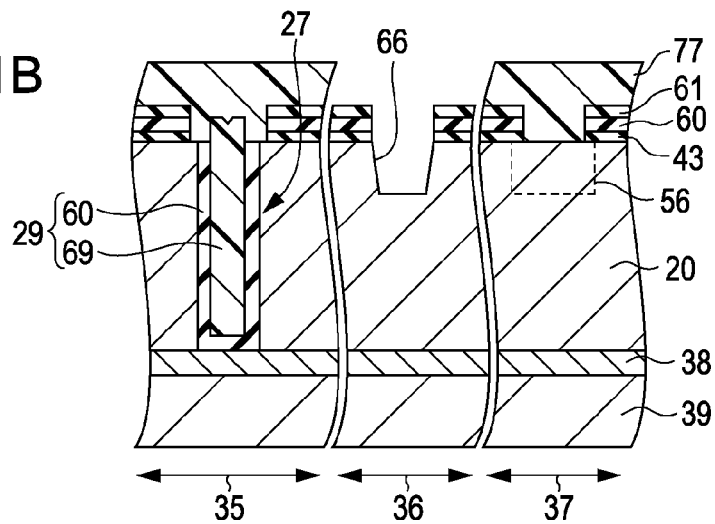

Next, as shown in FIG. 21B, a new photoresist film 77 is formed. In the photoresist film 77, an opening is formed in the STI forming region 36 and an opening is not formed in the alignment mark forming region 35 and the EDI forming region 37. That is, in the alignment mark forming region 35 and the EDI forming region 37, the photoresist film 77 is formed on the entire surface of the stopper film 61 including the exposed semiconductor layer 20. Thereafter, using the photoresist film 77 as a mask and using the buried film 60 and the stopper film 61 as a hard mask, the semiconductor layer 20 is etched and removed to a predetermined depth so as to form a groove 66 in the STI forming region 36. The groove 66 becomes a trench portion configuring the STI.

After the groove 66 is formed, desired impurities are ion-implanted into the surface of the semiconductor layer of the EDI forming region 37 so as to form an impurity diffusion layer 56 configuring the EDI.

Figure 21C:
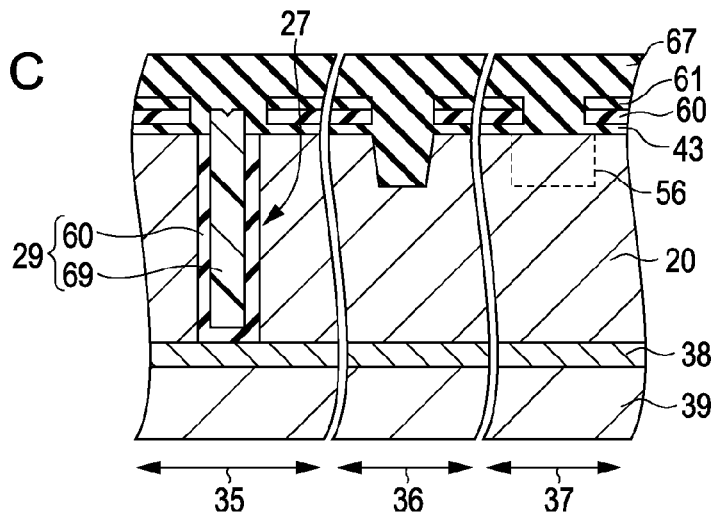

Next, the photoresist film 77 formed on the stopper film 61 is removed and, as shown in FIG. 21C, an insulating film 67 formed of SiO is formed on the groove 66 of the semiconductor layer 20 or the stopper film 61 including the semiconductor layer 20. Thus, in the alignment mark forming region 35, the upper portion of the alignment mark 27 formed of the insulating layer 29 is covered by the protective film 30 formed of the insulating film 67. In the STI forming region 36, the insulating film 67 is formed in the groove 66 which is the trench portion. In the EDI forming region 37, the insulating film 67 is formed on the semiconductor layer 20 in which the impurity diffusion layer 56 is formed.

Figure 22D:
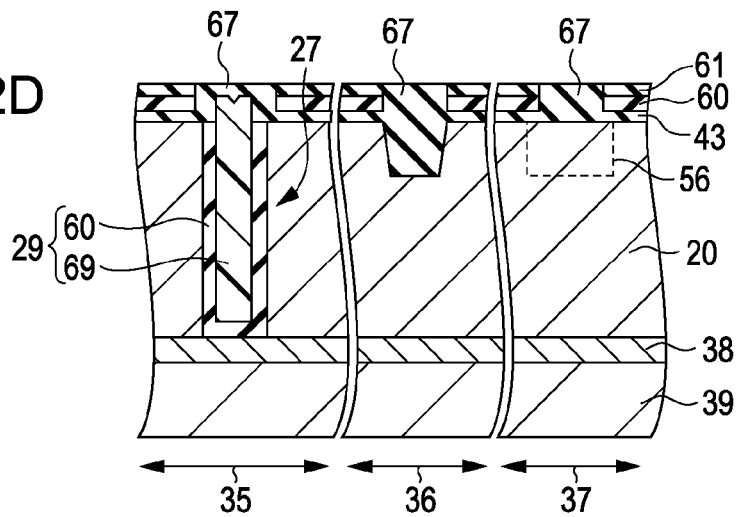
FIGS. 22D and 22E are diagrams showing a method of manufacturing the solid-state imaging device consistent with the present invention.
Figure 23:
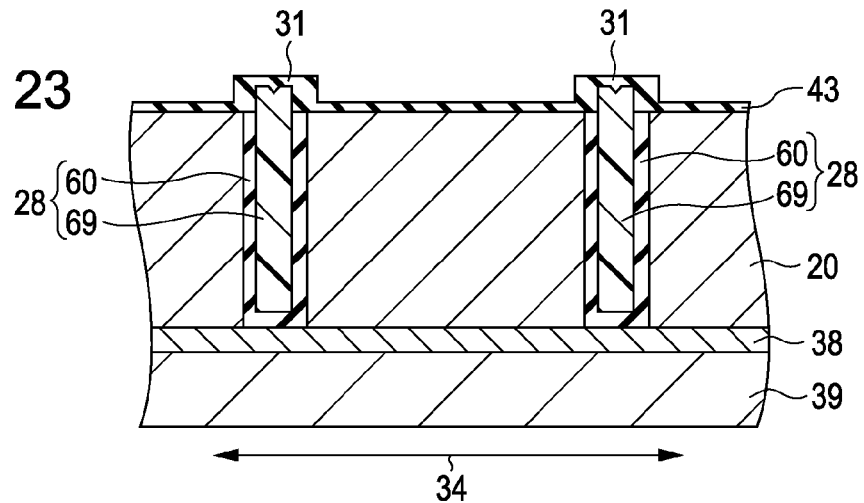
FIG. 23 is a schematic cross-sectional view of an electrode pad forming region of the solid-state imaging device consistent with the present invention.

Next as shown in FIG. 22D, for example, using a CMP method, the insulating film 67 formed of SiO is removed until the stopper film 61 formed of SiN on the semiconductor layer 20 is exposed.

Figure 22E:
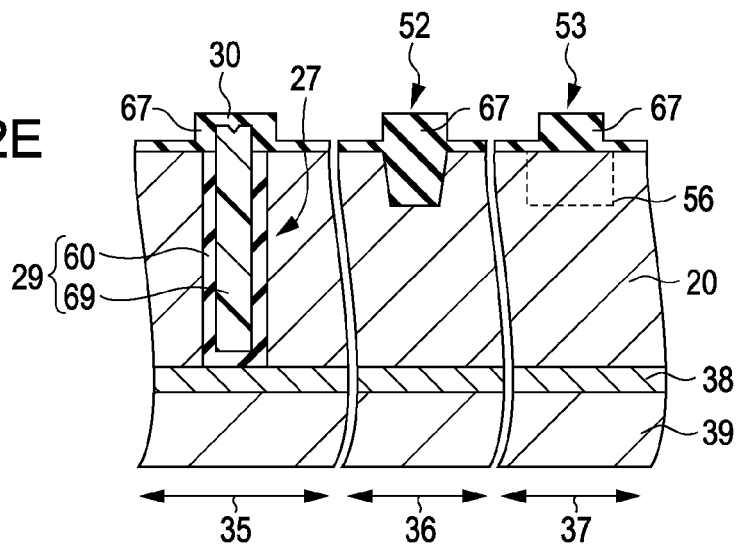

Next, as shown in FIG. 22E, the stopper film 61 formed of silicon nitride and the first buried film 60 are removed using hot phosphoric acid. Thus, in the alignment mark 27 forming region, the upper portion of the insulating layer 29 which is the alignment mark 27 is covered by the protective film 30. The STI 52 which is an element isolation portion is formed in the STI forming region 36, and the EDI 53 which is an element isolation portion is formed in the EDI forming region 37.

In the solid-state imaging device of the present embodiment, in the alignment mark forming region 35, the upper portion of the insulating layer 29 which is the alignment mark 27 is covered by the protective film 30 formed of the insulating film 67 formed in the same process as the insulating film 67 configuring the EDI 53. Thus, in the process of etching and removing the stopper film 61 formed of SiN and the first buried film 60, it is possible to prevent the insulating layer 29 configuring the alignment mark 27 from being unnecessarily etched.

Although the method of forming the alignment mark 27 is described in the description of FIGS. 21A to 22E, even in the present embodiment, the insulating layer 28 may be formed in the electrode pad forming region 34 using the same method as the method of forming the alignment mark 27.

FIG. 23 is a diagram showing the insulating layer 28 formed in a desired region of the electrode pad forming region 34 similar to the insulating layer 29 formed in the alignment mark forming region 35. In the electrode pad forming region 34, the insulating layer 28 is formed in the semiconductor layer 20 corresponding to a region surrounding the electrode pad 25 formed in the multi-layer wiring layer 21 simultaneously with the process of forming the alignment mark 27 of FIGS. 21A to 22E. The insulating layer 28 in the electrode pad forming region 34 surrounds the periphery of the opening 26 formed such that the electrode pad 25 faces the front surface side of the semiconductor layer 20 in a subsequent process.

Even in the electrode pad forming region 34, the protective film 31 is formed on the insulating layer 28 similar to the method of forming the protective film 30 on the alignment mark 27.

The solid-state imaging device of the present embodiment is completed in the same processes as FIGS. 20A to 20C. The processes are equal to those of the third embodiment and the description thereof will be omitted.

The same effects as the first to third embodiments are obtained in the present embodiment. In the present embodiment, the protective films 30 and 31 formed on the insulating layer 29 which is the alignment mark 27 and the insulating layer 28 formed in the electrode pad forming region 34 can be formed simultaneously with the insulating film 67 configuring the EDI 53. Thus, it is possible to form the protective films 30 and 31 without increasing the number of manufacturing processes.

The insulating layer formed of SiN is covered by the protective film formed of SiO in the first and second embodiments, and the insulating film formed of polysilicon and SiN is covered by the protective film formed of SiO in the third and fourth embodiments. The present invention is not limited to such materials and various materials may be used. That is, any configuration in which the insulating layer formed in the semiconductor layer is covered by the protective film so as not to be etched and removed in a subsequent process may be used. Although the example of forming the protective film simultaneously with the formation of the STI or the EDI is described in the first to fourth embodiments, the present invention is not limited thereto. For example, the protective film may be formed simultaneously with the formation of the element isolation of which Si is the several-nm trench portion.

If the insulating layer which is the alignment mark or the insulating layer formed in the electrode pad forming region is formed of SiO, polysilicon may be used as the protective film. The polysilicon may be formed simultaneously with the gate electrode formed on the semiconductor layer with a gate oxide film formed of SiO interposed therebetween. Thus, for example, even when the process of removing the gate oxide film is performed in the vicinity of the upper portion of the semiconductor layer in which the insulating layer formed of SiO is formed, the insulating layer is covered by the protective film formed of polysilicon, the insulating layer is not unnecessarily removed.

As the protective film, a film formed on the front surface side of the semiconductor layer after the process of forming the insulating layer of the semiconductor layer may be used. For example, SiON, SiC, SiOC, TiN, silicide, cobalt silicide, titanium silicide, nickel silicide, tungsten or the like may be variously selected. As the insulating layers, SiO, SiN, SiON or the like may be used.

Although the method of manufacturing the solid-state imaging device using the SOI substrate is described in the first to fourth embodiments, the present invention is not limited thereto and is applicable to a configuration in which a bulk substrate or the like is used.

Although the rear-surface irradiation type CMOS solid-state imaging device is described as an example in the first to fourth embodiments, the present invention is not limited to the rear-surface irradiation type CMOS solid-state imaging device and is applicable to a front-surface irradiation type solid-state imaging device.

The application to the CMOS type solid-state imaging device in which unit pixels for detecting signal charges in response to an incident light amount as a physical amount are arranged in a matrix is described in the first to fourth embodiments. However, the present invention is not limited to the application to the CMOS type solid-state imaging device. The present invention is not limited to column type solid-state imaging device, in which a column circuit is arranged in each pixel column of a pixel unit in which pixels are arranged in a two-dimensional matrix, as a whole.

The present invention is not limited to the solid-state imaging device for detecting and picking up a distribution of an incident light amount of visible light as an image and is applicable to a solid-state imaging device for picking up a distribution of an incident amount of infrared ray or X ray or particles as an image. In addition, the present invention is applicable to all solid-state image devices such as a fingerprint detecting sensor for detecting and picking up a distribution of another physical amount such as pressure or electrostatic capacity in a broad sense.

In addition, the present invention is not limited to a solid-state imaging device for sequentially scanning each unit pixel of a pixel unit in a row unit and reading pixel signals from each unit pixel. The present invention is applicable to an X-Y address type solid-state imaging device for selecting any pixel in pixel units and reading a signal from the selected pixel in pixel units. In addition, the solid-state imaging device may be formed as one chip or a module having an imaging function which is obtained by packaging a pixel unit, a signal processing unit or an optical system.

The present invention is not limited to a solid-state imaging device and is applicable to an imaging device. An imaging device indicates a camera system such as a digital camera or a video camera or an electronic apparatus having an imaging function, such as a mobile telephone. A module mounted in an electronic apparatus, that is, a camera module, may be an imaging device.

Figure 24:
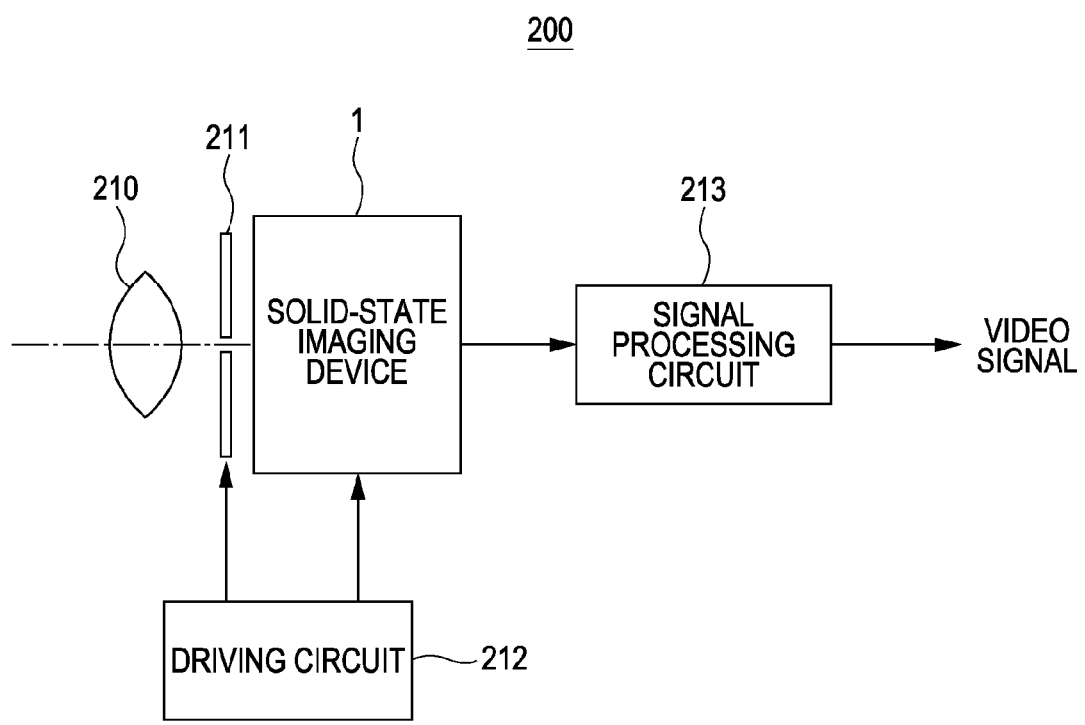
FIG. 24 is a schematic diagram showing a configuration of an electronic apparatus consistent with the present invention.
Figure 25A:
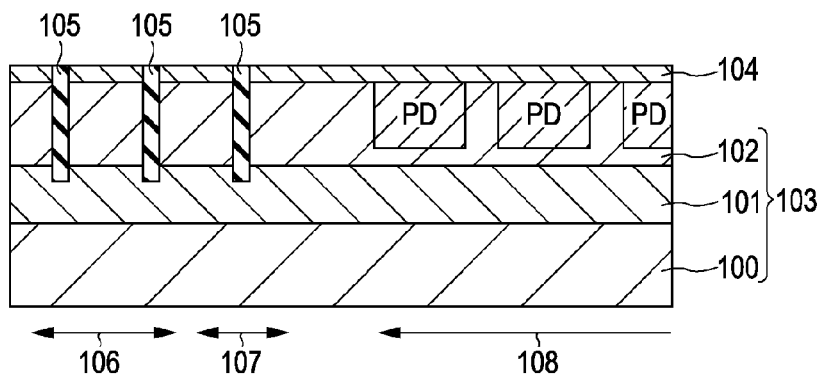
FIGS. 25A to 25C are diagrams showing a method of manufacturing a solid-state imaging device of the related art.
Figure 25B:
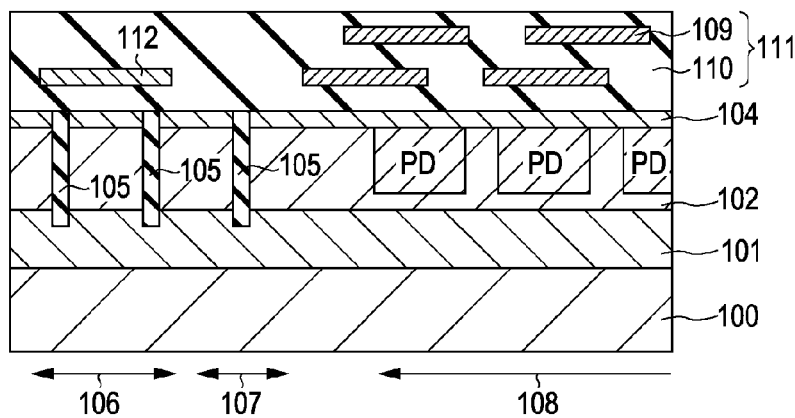
Figure 25C:
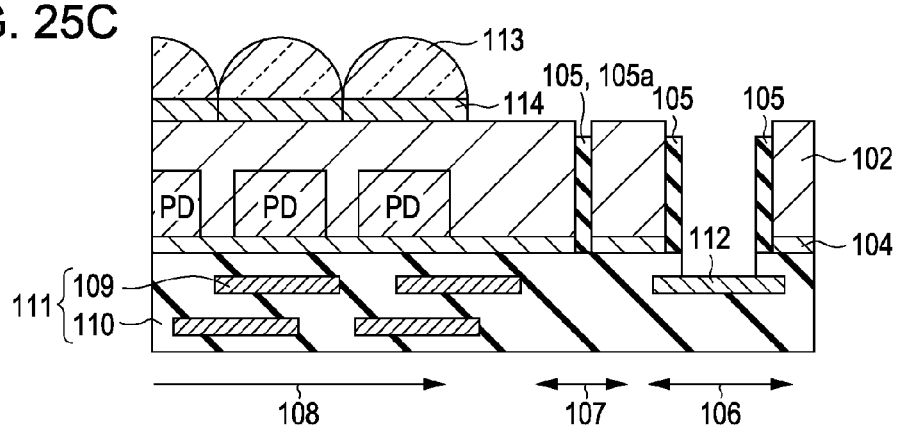
Figure 26:
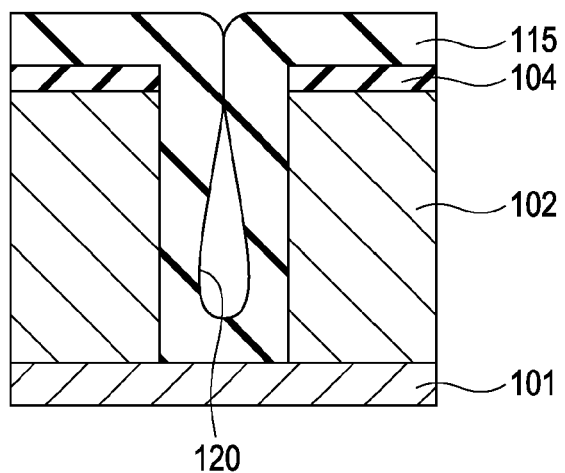
FIG. 26 is a schematic diagram of the case where an insulating layer is formed of SiO in the method of manufacturing the solid-state imaging device of the related art.
Figure 27A:
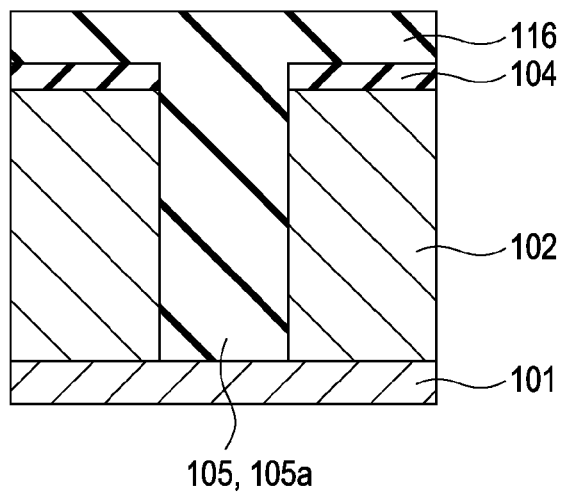
FIGS. 27A and 27B are schematic diagrams of the case where an insulating layer is formed of SiN in the method of manufacturing the solid-state imaging device of the related art.
Figure 27B:
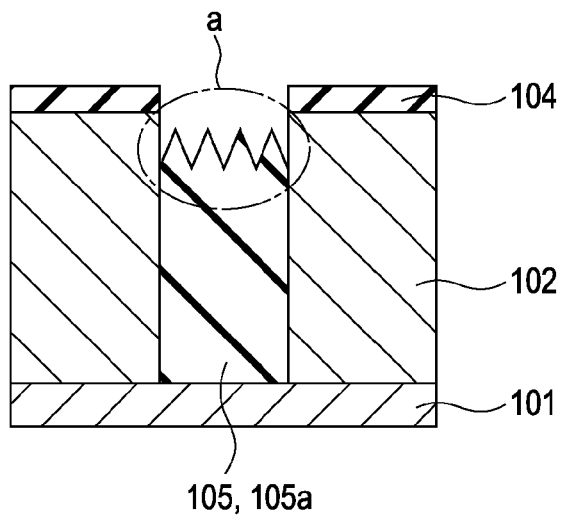

Next, an electronic apparatus according to a fifth embodiment of the present invention will be described. FIG. 24 is a schematic diagram showing the configuration of an electronic apparatus 200 according to the fifth embodiment of the present invention.

The electronic apparatus 200 of the present embodiment corresponds to an embodiment in which the solid-state imaging device 1 according to the first embodiment of the present invention is used in the electronic apparatus (camera).

The electronic apparatus 200 according to the present embodiment has the solid-state imaging device 1, an optical lens 210, a shutter device 211, a driving circuit 212 and a signal processing circuit 213.

The optical lens 210 forms an image beam (incident light) from a subject on an imaging surface of the solid-state imaging device 1. Thus, signal charges are accumulated in the solid-state imaging device 1 for a predetermined period of time.

The shutter device 211 controls a light irradiation period and a light shielding period of the solid-state imaging device 1.

The driving circuit 212 supplies a driving signal for controlling a transmission operation of the solid-state imaging device 1 and the shutter operation of the shutter device 211. The signal transmission of the solid-state imaging device 1 is performed by the driving signal (timing signal) supplied from the driving circuit 212. The signal processing circuit 213 performs various signal processing procedures. The processed video signal is stored in a storage medium such as a memory or output to a monitor.

In the electronic apparatus 200 of the present embodiment, in the solid-state imaging device 1, in order to improve reliability of the insulating layers 28 and 29 formed in the semiconductor layer 20, it is possible to obtain an electronic apparatus 200 with improved reliability.

The electronic apparatus 200 to which the solid-state imaging device 1 is applicable is not limited to a camera and is applicable to an imaging device such as a digital camera or a camera module for a mobile apparatus such as a mobile phone.

Although the solid-state imaging device 1 is used in the electronic apparatus in the present embodiment, the solid-state imaging device manufactured in the second to fourth embodiment may be used.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a semiconductor layer;
   a groove formed in the semiconductor layer;
   an insulating material having first and second end portions, the insulating material disposed in an opening penetrating a bottom surface of the groove formed in the semiconductor layer, wherein side portions of the first end portion are surrounded by and in direct contact with the semiconductor layer, wherein side portions of the second end portion and end portions of the second portion of the insulating material are located within groove formed in the semiconductor layer and between the bottom surface of the groove formed in the semiconductor layer and a non-grooved surface of the semiconductor layer; and
   a protective film that is resistant to etching surrounding side portions of the second end portion and end portions of the second end portion of the insulating material on an interior side of the semiconductor layer, wherein the protective film extends between tapered side surfaces of the groove located in the semiconductor layer and side portions of the second end portion of the insulating material.

2. The solid-state imaging device of claim 1, wherein the semiconductor layer has a pixel forming region.

3. The solid-state imaging device of claim 2, further comprising:
   a multi-layer wiring layer disposed on the semiconductor layer;
   an electrode pad in the multi-layer wiring layer outside of the pixel region of the semiconductor substrate; and
   an electrode pad opening through the semiconductor layer and multi-layer wiring layer that exposes the electrode pad.

4. The solid-state imaging device of claim 2, wherein:
   the opening is in an alignment region of the semiconductor layer, and
   the semiconductor layer has an element isolation region between the alignment region and the pixel forming region.

5. The solid-state imaging device of claim 4, further comprising:
   an impurity diffusion layer in the element isolation region; and
   an insulating film formed over the diffusion layer.

6. The solid-state imaging device of claim 4, further comprising a plurality of photodiodes in the semiconductor layer in the pixel region.

7. The solid-state imaging device of claim 6, further comprising an on-chip lens over each photodiode in the pixel region.

8. The solid-state imaging device of claim 7, further comprising a color filter between each on-chip lens and each photodiode.

9. The solid-state imaging device of claim 4, wherein the insulating material and the protective film are both made of the same material.

10. The solid-state imaging device of claim 1, wherein the insulating material contains silicon nitride.

11. An electronic apparatus comprising: an optical lens; arid
   a semiconductor device located in front of the optical lens, the semiconductor device including:
   a semiconductor layer;

a groove formed in the semiconductor layer;

an insulating material having first and second end portions, the insulting material disposed in an opening penetrating a bottom surface of the groove formed in the semiconductor layer, wherein side portions of the first end portion are surrounded by and in direct contact with the semiconductor layer, wherein side portions of the second end portion and end portions of the second portion of the insulating material are located within the groove formed in the semiconductor layer and between the bottom surface of the groove formed in the semiconductor layer and a non-grooved surface of the semiconductor layer; and a protective film that is resistant to etching which surrounds side portions of the second end portion and end portions of the second end portion of the insulating material on an interior side of the semiconductor layer, wherein the protective film extends between tapered side surfaces of the groove located in the semiconductor layer and side portions of the second end portion of the insulating material.

12. The electronic apparatus of claim 11, wherein the semiconductor layer has a pixel region.

13. The electronic apparatus of claim 12, wherein:
the opening is in an alignment region of the semiconductor layer, and
the semiconductor layer has an element isolation region between the alignment region and the pixel forming region.

14. The electronic apparatus of claim 13, further comprising:
an impurity diffusion layer in the element isolation region; and
an insulating film over the diffusion layer.

15. The electronic apparatus of claim 13, further comprising:
a multi-layer wiring layer over the semiconductor layer;
an electrode pad in the multi-layer wiring layer outside the pixel region of the semiconductor substrate; and
an electrode pad opening through the semiconductor layer and multi-layer wiring layer that exposes the electrode pad.

16. The electronic apparatus of claim 13, further comprising a plurality of photodiodes in the semiconductor layer in the pixel region.

17. The electronic apparatus of claim 13, further comprising an on-chip lens on each photodiode in the pixel region.

18. The electronic apparatus of claim 13, further comprising a color filter between each on-chip lens and each photodiode.

19. The electronic apparatus of claim 11, wherein the insulating material and the insulating film are both made of the same material.

20. The electronic apparatus of claim 11, wherein the insulating material contains silicon nitride.

21. The electronic apparatus of claim 11, further comprising a shutter device located between the optical lens and the solid state imaging device.

* * * * *